United States Patent
Sagae et al.

(10) Patent No.: US 9,142,565 B2
(45) Date of Patent: *Sep. 22, 2015

(54) SOI SUBSTRATE WITH ACCEPTOR-DOPED LAYER

(71) Applicant: Kabushiki Kaisha Toshiba, Minato-ku (JP)

(72) Inventors: Yoshitomo Sagae, Kanagawa-ken (JP); Fumio Sasaki, Kanagawa-ken (JP); Ryoichi Ohara, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/915,307

(22) Filed: Jun. 11, 2013

(65) Prior Publication Data

US 2013/0270640 A1 Oct. 17, 2013

Related U.S. Application Data

(60) Continuation of application No. 13/399,779, filed on Feb. 17, 2012, now abandoned, which is a division of application No. 12/046,033, filed on Mar. 11, 2008, now Pat. No. 8,134,224.

(30) Foreign Application Priority Data

Mar. 12, 2007 (JP) ................................. 2007-062137

(51) Int. Cl.
*H01L 27/12* (2006.01)
*H01L 21/762* (2006.01)
(Continued)

(52) U.S. Cl.
CPC ...... *H01L 27/1203* (2013.01); *H01L 21/76264* (2013.01); *H01L 23/552* (2013.01); *H01L 23/66* (2013.01); *H01L 29/16* (2013.01); *H01L 29/78603* (2013.01); *H01L 21/823878* (2013.01); *H01L 2924/0002* (2013.01); *H01L 2924/3011* (2013.01)

(58) Field of Classification Search
None
See application file for complete search history.

(56) References Cited

U.S. PATENT DOCUMENTS

| 5,641,980 A | 6/1997 | Yamaguchi et al. |
| 7,071,530 B1 | 7/2006 | Ding et al. |

(Continued)

FOREIGN PATENT DOCUMENTS

| JP | 2000-323658 | 11/2000 |
| JP | 2000-357904 | 12/2000 |
| JP | 2005-536037 | 11/2005 |

OTHER PUBLICATIONS

C. Tinella, et al., "0.13μm CMOS SOI SP6T Antenna Switch for Multi-Standard Handsets", 2006 Topical Meeting on Silicon Monolithic Integrated Circuits in RF Systems, SiRF, 2006, pp. 58-61.

(Continued)

*Primary Examiner* — Daniel Luke
(74) *Attorney, Agent, or Firm* — Oblon, McClelland, Maier & Neustadt, L.L.P.

(57) ABSTRACT

A semiconductor device includes a SOI substrate including a silicon substrate, an oxide layer on the silicon substrate, and a silicon layer on the oxide layer; a source region and a drain region formed in the silicon layer; and an acceptor-doped layer formed between the oxide layer and the silicon substrate, the acceptor-doped layer being doped with acceptors.

8 Claims, 21 Drawing Sheets

(51) Int. Cl.
*H01L 23/552* (2006.01)
*H01L 23/66* (2006.01)
*H01L 29/786* (2006.01)
*H01L 29/16* (2006.01)
*H01L 21/8238* (2006.01)

(56) References Cited

U.S. PATENT DOCUMENTS

| | | | |
|---|---|---|---|
| 8,134,224 B2 * | 3/2012 | Sagae et al. | 257/655 |
| 2003/0090313 A1 | 5/2003 | Burgener et al. | |
| 2003/0178678 A1 | 9/2003 | Wei et al. | |
| 2003/0228722 A1 | 12/2003 | Wristers et al. | |
| 2004/0017701 A1 | 1/2004 | Asano et al. | |
| 2004/0169227 A1 * | 9/2004 | Wei et al. | 257/347 |
| 2007/0102730 A1 | 5/2007 | Nakatsuka et al. | |
| 2007/0164360 A1 | 7/2007 | Morooka et al. | |

OTHER PUBLICATIONS

Kazumasa Kohama, et al., "An Antenna Switch MMIC for GSM/UMTS Handsets Using E/D-Mode JPHEMT Technology", 2005 IEEE Radio Frequency Integrated Circuits Symposium, RTU3D-3, 2005, pp. 509-512.

Office Action mailed Apr. 16, 2012 in Japan Application No. 2007-062137 (w/English translation).

* cited by examiner

SOI SUBSTRATE WITH ACCEPTOR-DOPED LAYER

CROSS-REFERENCE TO RELATED APPLICATIONS

This application is a continuation of and claims the benefit of priority under 35 U.S.C. §120 from Ser. No. 13/399,779 filed Feb. 17, 2012, which is a division of U.S. Ser. No. 12/046,033 filed Mar. 11, 2008 (now U.S. Pat. No. 8,134,224 issued Mar. 13, 2012), and claims the benefit of priority under 35 U.S.C. §119 from Japanese Patent Application No. 2007-062137 filed Mar. 12, 2007; the entire contents of each of which are incorporated herein by reference.

BACKGROUND OF THE INVENTION

1. Field of the Invention

This invention relates to a semiconductor device, and more particularly to a semiconductor device having a silicon substrate and receiving as input a radio frequency signal.

2. Background Art

Conventionally, semiconductor devices adapted to radio frequency (RF) signals having frequencies above 500 MHz are often based on compound semiconductors such as GaAs (gallium arsenide) or InP (indium phosphide). The reason is that these compound semiconductors have higher electron mobility than silicon, being advantageous to high-speed operation, and that semi-insulating substrates can be easily obtained from these compound semiconductors, allowing reduction of parasitic capacitance.

However, compound semiconductors have a higher material cost than silicon and have difficulty in increasing the wafer diameter. Hence there is a problem of a correspondingly high process cost in manufacturing semiconductor devices from compound semiconductors. On the other hand, recently, semi-insulating substrates having a specific resistance of 1 kQcm or more have been made available also in the form of silicon substrates. Furthermore, a current-gain cutoff frequency of 10 GHz or more has been realized also in semiconductor devices based on silicon substrates. Thus use of silicon substrates is gradually increasing also in semiconductor devices for radio frequency application. With regard to semiconductor devices for radio frequency application, there is disclosed a technique for increasing the operating speed of a semiconductor device by forming a thick insulating film on a silicon substrate and forming circuits and interconnects on the insulating film, thereby reducing parasitic capacitance between the circuits/interconnects and the silicon substrate (see, e.g., C. Tinella, et al., "0.13 µm CMOS SOI SP6T antenna switch for multi-standard handsets", 2006 Topical Meeting on Silicon Monolithic Integrated Circuits in RF Systems, Dig. pp. 58-61, 2006).

However, a semiconductor device including a radio frequency circuit on a silicon substrate has a problem of the increase of harmonics, particularly second harmonics, of RF signals.

SUMMARY OF THE INVENTION

According to an aspect of the invention, there is provided a semiconductor device receiving as input a radio frequency signal having a frequency of 500 MHz or more and a power of 20 dBm or more, including: a silicon substrate; a silicon oxide film formed on the silicon substrate; a radio frequency interconnect provided on the silicon oxide film and passing the radio frequency signal; a fixed potential interconnect provided on the silicon oxide film and placed at a fixed potential; and an acceptor-doped layer formed in a region of the silicon substrate, the region being in contact with the silicon oxide film, the acceptor-doped layer being doped with acceptors.

According to another aspect of the invention, there is provided a semiconductor device receiving as input a radio frequency signal having a frequency of 500 MHz or more and a power of 20 dBm or more, including: a silicon substrate; a silicon oxide film formed on the silicon substrate; a radio frequency interconnect provided on the silicon oxide film and passing the radio frequency signal; a fixed potential interconnect provided on the silicon oxide film and placed at a fixed potential; and a trench formed in a region of the silicon oxide film located between the radio frequency interconnect and the fixed potential interconnect as viewed perpendicular to a surface of the silicon substrate, the trench reaching the silicon substrate.

According to still another aspect of the invention, there is provided a semiconductor device receiving as input a radio frequency signal having a frequency of 500 MHz or more and a power of 20 dBm or more, including: a silicon substrate; a silicon oxide film formed on the silicon substrate; a plurality of transistors provided on the silicon oxide film; and a trench formed in a region of the silicon oxide film located between the transistors as viewed perpendicular to a surface of the silicon substrate, the trench reaching the silicon substrate.

DETAILED DESCRIPTION OF THE INVENTION

Embodiments of the invention will now be described with reference to the drawings.

First, a first embodiment of the invention is described.

Figure 1:
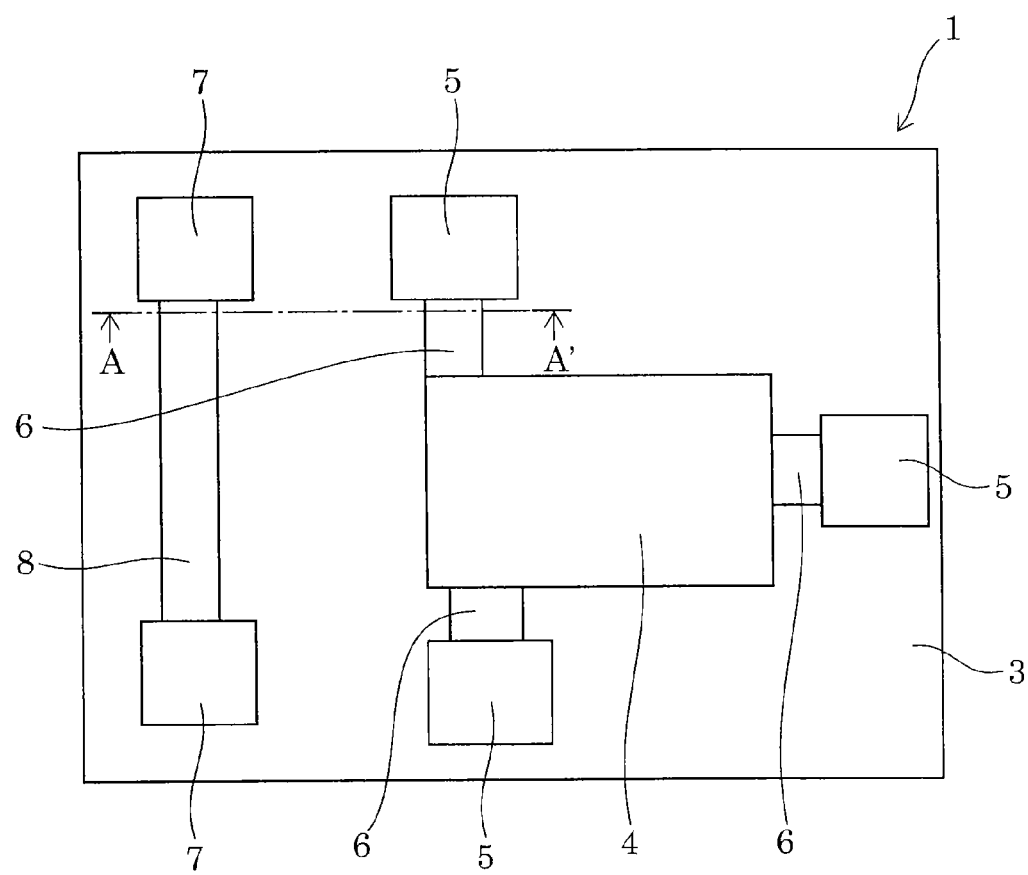
FIG. 1 is a plan view illustrating a semiconductor device according to a first embodiment of the invention.

FIG. 1 is a plan view illustrating a semiconductor device according to this embodiment.

Figure 2:
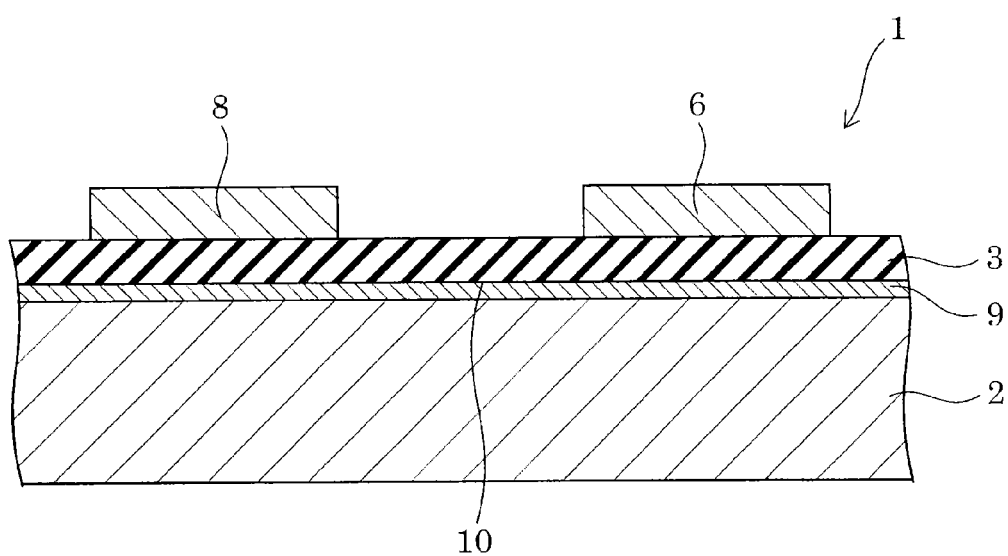
FIG. 2 is a cross-sectional view taken along line A-A' shown in FIG. 1.

FIG. 2 is a cross-sectional view taken along line A-A' shown in FIG. 1.

Figure 3:
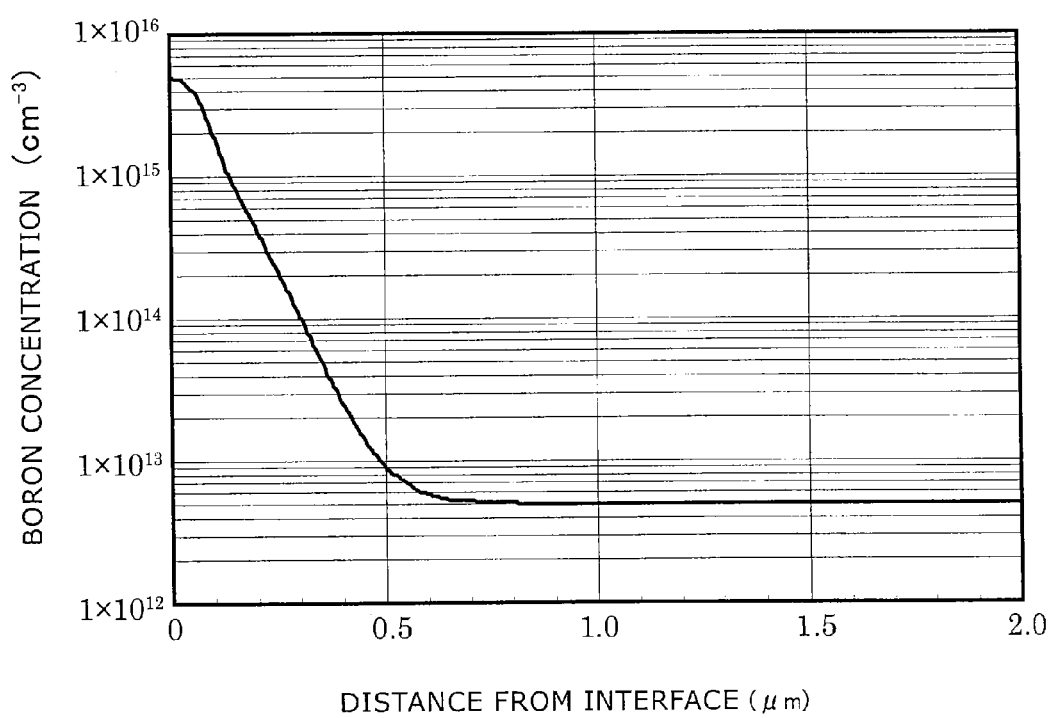
FIG. 3 is a graph illustrating a boron concentration profile in the silicon substrate along the depth, where the horizontal axis represents distance from the interface between the silicon substrate and the silicon oxide film, and the vertical axis represents boron concentration.

FIG. 3 is a graph illustrating a boron concentration profile in the silicon substrate along the depth, where the horizontal axis represents distance from the interface between the silicon substrate and the silicon oxide film, and the vertical axis represents boron concentration.

As shown in FIGS. 1 and 2, the semiconductor device 1 according to this embodiment receives as input a radio frequency signal (RF signal) having a frequency of 500 MHz or more and a power of 20 dBm (=100 mW) or more. For example, in a mobile communication apparatus, the semiconductor device 1 serves as a radio frequency switch circuit through which an antenna is connected to a transmitting circuit and a receiving circuit.

The semiconductor device 1 includes a silicon substrate 2 made of P-type single crystal silicon (Si) doped with P-type dopants such as boron (B). A silicon oxide film 3 made of silicon oxide ($SiO_2$) is provided on the silicon substrate 2. The silicon oxide film 3 is in contact with the silicon substrate 2 and has a thickness of 1 μm, for example. A radio frequency circuit 4 is provided on the silicon oxide film 3. Bonding pads 5 for inputting/outputting an RF signal to/from the radio frequency circuit 4 are provided illustratively at three locations. Three interconnects 6, for example, are provided for connecting the radio frequency circuit 4 to the respective bonding pads 5. Furthermore, on the silicon oxide film 3, bonding pads 7 to be placed at the ground potential (GND) and interconnects 8 connected to the bonding pads 7 are provided.

A boron-doped layer 9 serving as an acceptor-doped layer is formed in a region of the silicon substrate 2 being in contact with the silicon oxide film 3. The boron-doped layer 9 is doped with boron at a higher concentration than in the region of the silicon substrate 2 other than the boron-doped layer 9. The boron-doped layer 9 is illustratively formed throughout the interface 10 between the silicon substrate 2 and the silicon oxide film 3.

The thickness of the boron-doped layer 9 is illustratively 1 μm or less, and the sheet concentration of boron in the boron-doped layer 9 is illustratively $4.0 \times 10^{10}$ to $3.5 \times 10^{11}$ cm$^{-2}$. That is, the sheet concentration of boron in the region of the silicon substrate 2 located from the interface 10 to a depth of 1 μm is illustratively $4.0 \times 10^{10}$ to $3.5 \times 10^{11}$ cm$^{-2}$ higher than the sheet concentration of boron in the through-thickness center portion of the silicon substrate 2, i.e., in a 1 μm-thick layer of the portion other than the 1 μm-thick top portion and the 5 μm-thick bottom portion.

As shown in FIG. 3, in an example, the boron concentration in the silicon substrate 2 is maximized near the upper surface of the silicon substrate 2, that is, near the interface 10 with the silicon oxide film 3, decreases with the depth, and remains constant below a certain depth. For example, the boron concentration is approximately $5 \times 10^{15}$ cm$^{-3}$ near the interface 10, monotonically decreases with the depth from the interface 10 to the position of approximately 0.6 μm, becomes approximately $5 \times 10^{12}$ cm$^{-3}$ at the position of approximately 0.6 μm from the interface 10, and remains generally constant at positions therebelow. That is, the average boron concentration in the silicon substrate 2 is approximately $5 \times 10^{12}$ cm$^{-3}$. Hence it can be said that the boron-doped layer 9 has a lower surface located at 0.6 μm below the interface 10 and has a thickness of 0.6 μm.

In this example, the sheet concentration of boron in the region located from the interface 10 to a depth of 1 μm is $5.10 \times 10^{10}$ cm$^{-2}$. On the other hand, the average boron concentration in the through-thickness center portion of the silicon substrate 2, i.e., in the portion other than the 1 μm-thick top portion and the 5 μm-thick bottom portion, is $5 \times 10^{12}$ cm$^{-3}$. Hence the sheet concentration of boron in a region having a thickness of 1 μm (=$10^{-4}$ cm) in this through-thickness center portion is $5 \times 10^{8}$ cm$^{-2}$ (=$0.05 \times 10^{10}$ cm$^{-2}$). Therefore the sheet concentration of boron in the region located from the interface 10 to a depth of 1 μm is $5.05 \times 10^{10}$ cm$^{-2}$ (=$5.10 \times 10^{10} - 0.05 \times 10^{10}$ cm$^{-2}$) higher than the sheet concentration of boron in a 1 μm-thick layer in the remaining region of the substrate.

In the above example, the boron concentration is illustratively maximized near the interface 10 in the boron concentration profile along the depth. However, this embodiment is not limited thereto, but the boron concentration may be maximized at a position spaced from the interface 10. For example, it may be maximized at a position spaced approximately 0.4 μm below the interface 10.

Next, a method for manufacturing the above semiconductor device 1 is described.

First, a silicon substrate 2 having a boron concentration of $5 \times 10^{12}$ cm$^{-3}$ is prepared. Thermal oxidation is performed on this silicon substrate 2 to form a silicon oxide film 3 having a thickness of 1 μm, for example, in its upper surface. Next, boron ion implantation is performed from above the silicon substrate 2 under the condition of an acceleration voltage of 350 keV and a dose amount of $1.5 \times 10^{11}$ cm$^{-2}$, for example. Thus boron passes through the silicon oxide film 3 and is implanted in a region of the silicon substrate 2 being in contact with the silicon oxide film 3. Next, heat treatment is performed to activate the implanted boron under the condition of a temperature of 950° C. and a retention time of 1 minute, for example. Thus a boron-doped layer 9 is formed. Subsequently, a photolithography process is applied to form a radio frequency circuit 4, bonding pads 5, interconnects 6, bonding pads 7, and interconnects 8 on the silicon oxide film 3. Consequently, the semiconductor device 1 is manufactured.

Next, the operation and effect of this embodiment are described in contrast to a comparative example.

Figure 4:
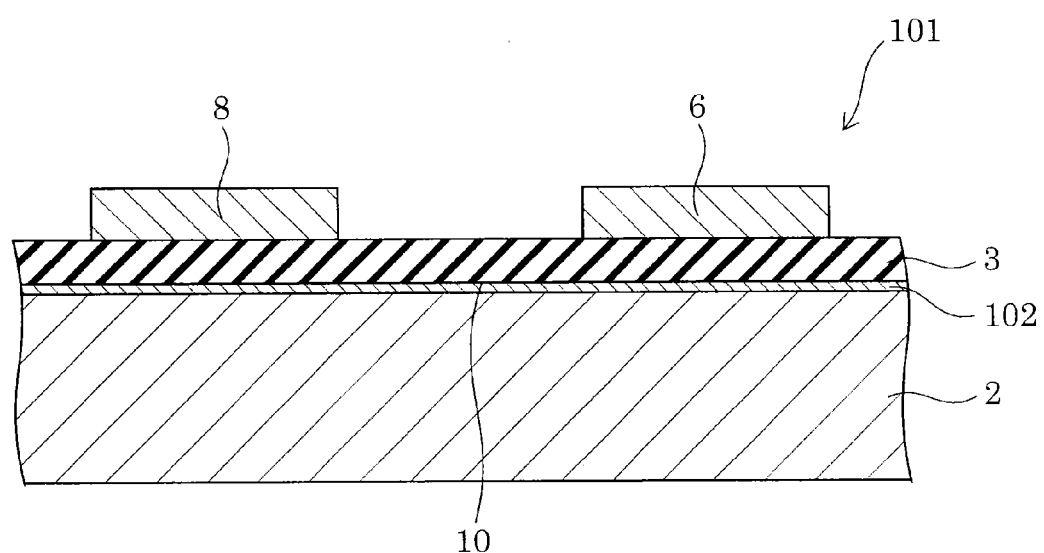
FIG. 4 is a cross-sectional view illustrating a semiconductor device according to a comparative example of this embodiment.

FIG. 4 is a cross-sectional view illustrating a semiconductor device according to a comparative example of this embodiment.

The plan view of the semiconductor device shown in FIG. 4 is the same as that in FIG. 1.

As shown in FIG. 4, the semiconductor device 101 according to the comparative example has no boron-doped layer 9 (see FIG. 2) in the region of the silicon substrate 2 being in contact with the silicon oxide film 3. The configuration of the semiconductor device 101 other than the foregoing is the same as that of the semiconductor device 1 according to this embodiment described above. The method for manufacturing the semiconductor device 101 is the same as the above method for manufacturing the semiconductor device 1 except that boron ion implantation is omitted.

In this semiconductor device 101, dangling bonds at the interface 10 of the silicon oxide film 3 act as positive charges. Hence electrons gather in a region of the silicon substrate 2 being in contact with the interface 10 and serve as interface carriers to form an interface carrier layer 102. In the case where a silicon oxide film having a thickness of 1 μm is formed by thermal oxidation as in this comparative example, the sheet concentration of interface carriers is approximately $5 \times 10^{10}$ to $1.0 \times 10^{11}$ cm$^{-2}$.

When an RF signal is inputted to the radio frequency circuit 4 of the semiconductor device 101, the variation of voltage between the interconnect 6 conducting the RF signal and the interconnect 8 placed at the ground potential causes interface carriers to migrate, resulting in a current in the silicon substrate 2. This generates harmonics of the RF signal.

In contrast, in the semiconductor device 1 of this embodiment as shown in FIG. 2, a boron-doped layer 9 is formed in a region of the silicon substrate 2 being in contact with the interface 10. This boron-doped layer 9 serves as a source of holes, being operable for charge compensation of electrons gathering near the interface 10 to decrease interface carriers contributing to conduction. In an example, the sheet concentration of interface carriers contributing to conduction decreases to $0.05 \times 10^{10}$ cm$^{-2}$. Consequently, harmonic generation is suppressed even if an RF signal is passed through the interconnect 6. In general, harmonic generation becomes prominent for input of harmonic signals having a frequency of 500 MHz or more and a power of 20 dBm or more. Hence the semiconductor device according to this embodiment is suitable for applications involving input of harmonic signals having a frequency of 500 MHz or more and a power of 20 dBm or more.

In the following, an example test demonstrating the effect of this embodiment is described.

Figure 5:
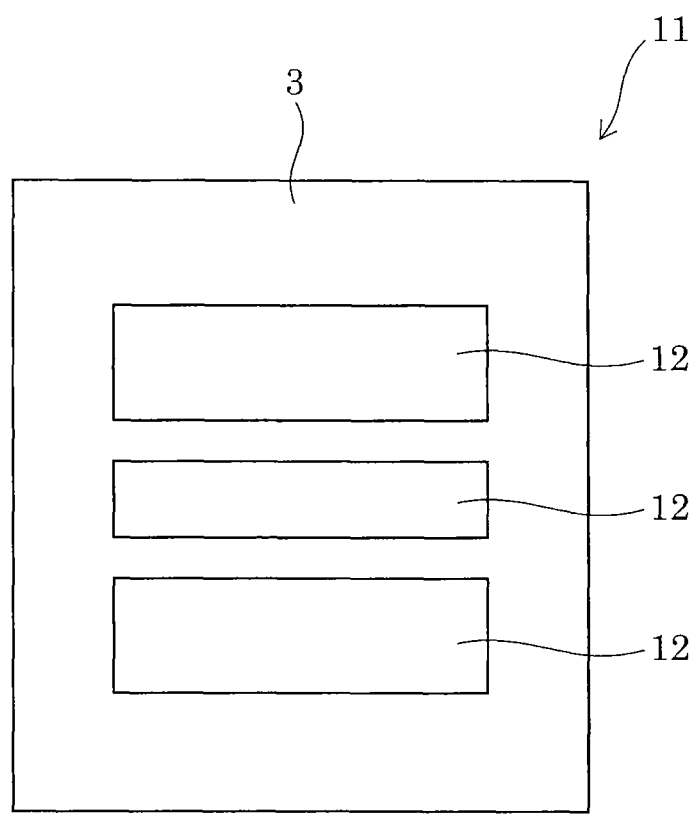
FIG. 5 is a plan view of a test sample used in an example test of this embodiment.

FIG. 5 is a plan view of a test sample used in this example test.

Figure 6:
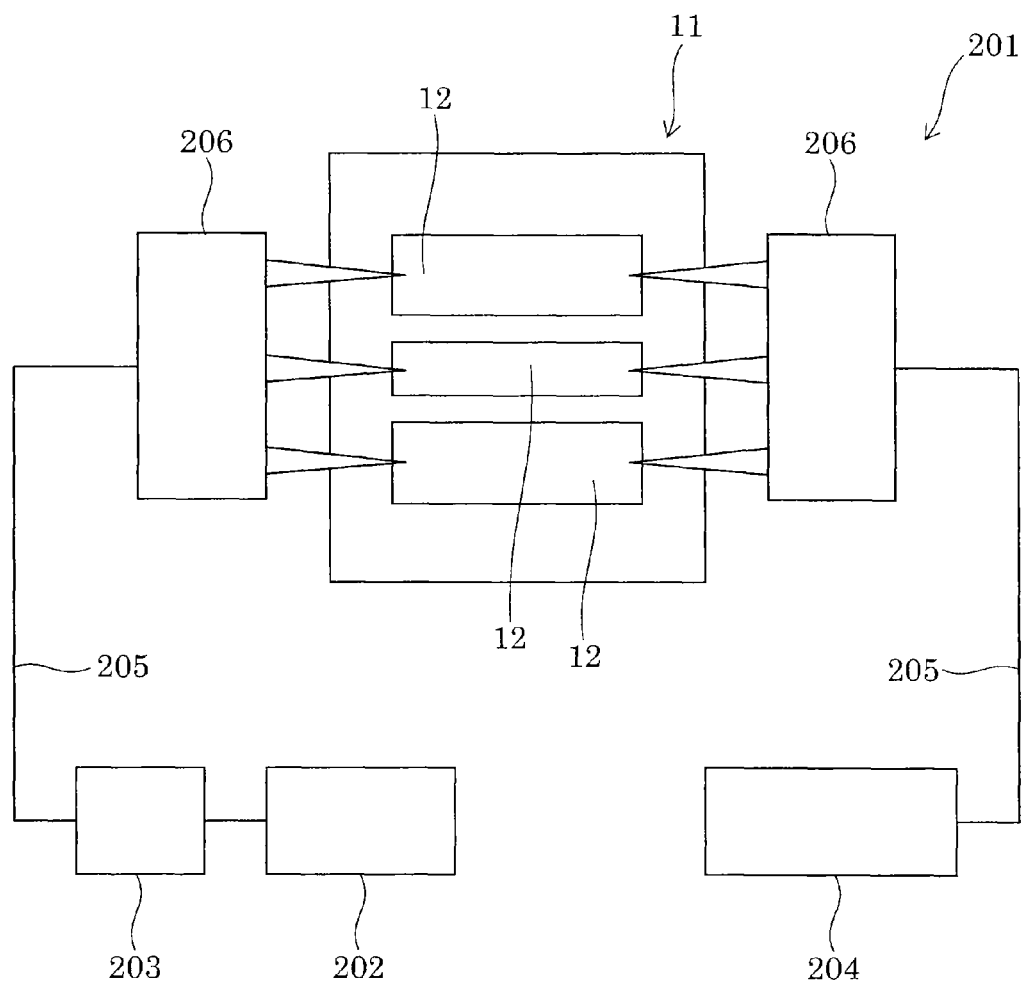
FIG. 6 is a block diagram showing a test apparatus used in an example test of this embodiment.

FIG. 6 is a block diagram showing a test apparatus used in this example test.

As shown in FIG. 5, as in the above first embodiment, the test sample 11 includes a silicon oxide film 3 on a silicon substrate 2 (see FIG. 2). A test pattern of three interconnects 12 arranged in parallel to each other is formed on the silicon oxide film 3. The test sample 11 according to the inventive example of this embodiment includes a boron-doped layer 9 (see FIG. 2) in the silicon substrate 2 near its upper surface, whereas the test sample 11 according to the comparative example includes no boron-doped layer.

As shown in FIG. 6, the test apparatus 201 includes a radio frequency signal source 202, a radio frequency power amplifier 203, a spectrum analyzer 204, a pair of SMA (Sub Miniature Type A) cables 205, and a pair of radio frequency probes 206. The radio frequency signal source 202, the radio frequency power amplifier 203, one SMA cable 205, one radio frequency probe 206, the interconnects 12, the other radio frequency probe 206, the other SMA cable 205, and the spectrum analyzer 204 are connected in series in this order by bringing the pair of radio frequency probes 206 into contact with either end of the interconnects 12 of the test sample 11.

In this condition, the radio frequency signal source 202, the radio frequency power amplifier 203, and the spectrum analyzer 204 are activated. An RF signal outputted from the radio frequency signal source 202 is amplified by the radio frequency power amplifier 203 and inputted to one end of the interconnects 12 through the one SMA cable 205 and radio frequency probe 206. At this time, the RF signal is inputted only to the center interconnect 12, whereas the interconnects 12 on both sides thereof are placed at the ground potential. The RF signal conducted through the interconnect 12 is passed from the other end of the interconnect 12 through the other radio frequency probe 206 and SMA cable 205 and inputted to the spectrum analyzer 204. The spectrum analyzer 204 detects a potential difference between the center interconnect 12 and the side interconnects 12 and measures the intensity of second harmonics.

By way of example, an RF signal having a frequency of 2 GHz was inputted to the test sample 11. For an input amplitude of 35 dBm and a characteristic impedance of 50Ω, the voltage amplitude was approximately 18 V, and the magnitude of second harmonics was as shown in TABLE 1 below. As seen from TABLE 1, generation of second harmonics was lower in the inventive example than in the comparative example.

TABLE 1

| | Boron-doped layer | RF signal power (dBm) | |
|---|---|---|---|
| | | 20 | 35 |
| Inventive example | Included | −93 dBc | −78 dBc |
| Comparative example | Not included | −83 dBc | −68 dBc |

In the boron-doped layer 9, even a slightest amount of boron introduced therein decreases the effective interface carriers by that amount and hence achieves an effect of suppressing harmonic generation. However, to ensure this effect, the sheet concentration of boron in the boron-doped layer 9 is preferably comparable to or higher than the sheet concentration of interface carriers. When the silicon oxide film 3 has a practical thickness of 0.1 μm or more, the sheet concentration of interface carriers is $4.0 \times 10^{10}$ cm$^{-2}$ or more, and hence the sheet concentration of boron in the boron-doped layer 9 is preferably $4.0 \times 10^{10}$ cm$^{-2}$ or more. On the other hand, as described above, the sheet concentration of interface carriers is approximately $5 \times 10^{10}$ to $1.0 \times 10^{11}$ cm$^{-2}$, and in single crystal silicon, the electron mobility is approximately 1400 cm$^2$/V·sec and the hole mobility is 400 cm$^2$/V·sec. Hence a boron sheet concentration of $3.5 \times 10^{11}$ cm$^{-2}$ ($=1400/400 \times 1.0 \times 10^{11}$ cm$^{-2}$) is sufficient, in calculation, for charge compensation of all interface carriers. Therefore the sheet concentration of boron in the boron-doped layer 9 is preferably $4.0 \times 10^{10}$ to $3.5 \times 10^{11}$ cm$^{-2}$.

In this embodiment, the condition for forming the boron-doped layer 9 is not limited to the above condition. For example, when the thickness of the silicon oxide film 3 is 2 μm, a preferable acceleration voltage for ion implantation is approximately 1.1 MeV. The heat treatment condition for activating doped boron is not limited to 950° C. and 1 minute, but any other conditions can be used if boron is activated.

In the method of the example described above, a silicon oxide film 3 is formed by thermal oxidation, and then boron is introduced into the silicon substrate 2 by ion implantation. However, this embodiment is not limited thereto. For example, after a boron-doped layer 9 is formed in the silicon substrate 2 by solid state diffusion or ion implantation, an $SiO_2$ film may be deposited by normal pressure CVD (chemical vapor deposition) using TEOS (tetraethyl orthosilicate $(Si(OC_2H_5)_4)$) as a raw material to form a silicon oxide film 3. Such change of the formation method or material for the silicon oxide film 3 may also vary the concentration of interface carriers. However, the interface carrier concentration is not likely to be lower than $4\times10^{10}$ $cm^{-2}$, which occurs in the case where the thermal oxide film is formed to a thickness of 0.1 μm. Hence charge compensation for interface carriers can be ensured if the sheet concentration of boron is $4\times10^{10}$ $cm^{-2}$ or more.

Next, a second embodiment of the invention is described.

Figure 7:
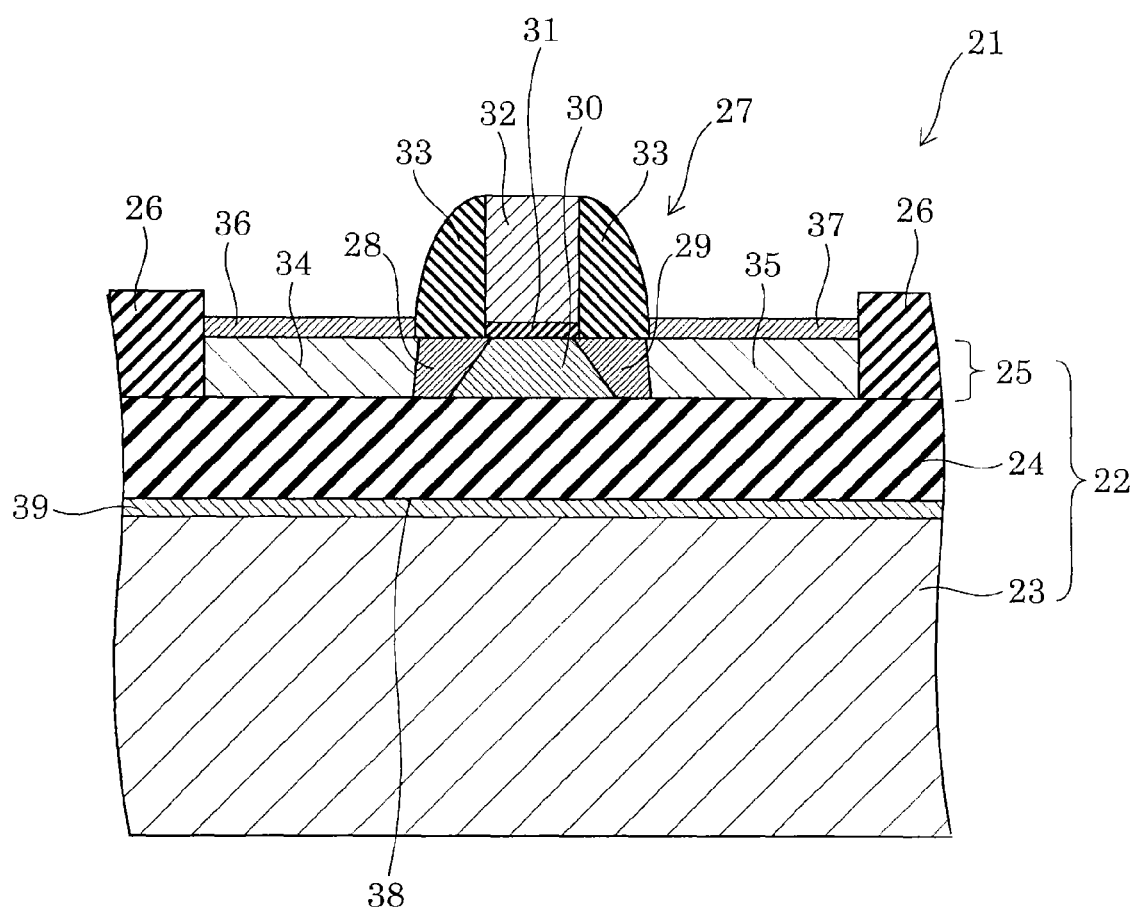
FIG. 7 is a cross-sectional view illustrating a semiconductor device according to a second embodiment of the invention.

FIG. 7 is a cross-sectional view illustrating a semiconductor device according to this embodiment.

The cross-sectional view of FIG. 7 shows a MOSFET (metal oxide semiconductor field effect transistor), which is used in the radio frequency circuit 4 shown in FIG. 1 for conduction of a radio frequency signal (RF signal) having a frequency of 500 MHz or more and a power of 20 dBm or more. This MOSFET is formed on an SOI (silicon on insulator) substrate.

More specifically, the semiconductor device 21 includes an SOI (silicon on insulator) substrate 22. The SOI substrate 22 includes a P-type high-resistance silicon substrate 23 doped with boron (B) and having a specific resistance of 1 kΩ·cm or more. A BOX (buried oxide) layer 24 is provided as a silicon oxide film on the high-resistance silicon substrate 23, and a silicon layer 25 is provided on the BOX layer 24. The thickness of the BOX layer 24 is illustratively 2 μm, and the thickness of the silicon layer 25 is illustratively 0.13 μm.

The silicon layer 25 includes a device isolation region 26 made of silicon oxide and reaching the BOX layer 24, and a MOSFET 27 is formed in a region partitioned by the device isolation region 26. More specifically, a source region 28 and a drain region 29 made of a pair of $n^+$-type layers are formed in the silicon layer 25, and the region between the source region 28 and the drain region 29 constitutes a channel region 30. A gate oxide film 31 is formed on the silicon layer 25 directly above the channel region 30, and a gate electrode 32 is provided on the gate oxide film 31. A sidewall 33 is provided on the lateral side of the gate electrode 32. On the other hand, ohmic contact layers 34 and 35 are formed in regions of the silicon layer 25 being in contact with the source region 28 and the drain region 29, respectively. A source electrode 36 is provided on the surface of the ohmic contact layer 34, and a drain electrode 37 is provided on the surface of the ohmic contact layer 35.

A boron-doped layer 39 is formed in a region of the high-resistance silicon substrate 23 being in contact with the BOX layer 24. The thickness of the boron-doped layer 39 is illustratively 1 μm or less, and the sheet concentration of boron is illustratively $4.0\times10^{10}$ to $3.5\times10^{11}$ $cm^{-2}$. That is, the sheet concentration of boron in the region of the high-resistance silicon substrate 23 located from the interface 38 with the BOX layer 24 to a depth of 1 μm is illustratively $4.0\times10^{10}$ to $3.5\times10^{11}$ $cm^{-2}$ higher than the sheet concentration of boron in a 1 μm-thick layer of the portion of the high-resistance silicon substrate 23 other than the 1 μm-thick top portion and the 5 μm-thick bottom portion.

Next, a method for manufacturing the semiconductor device 21 according to this embodiment is described.

Figure 8A:
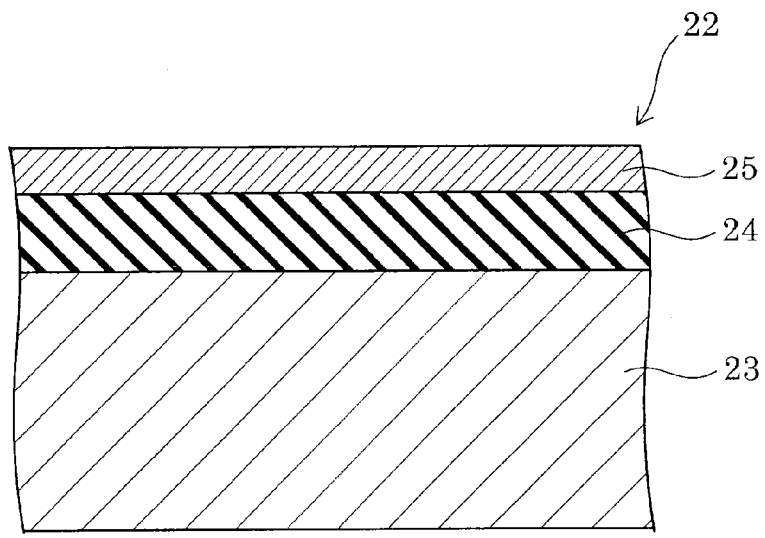
FIGS. 8A to 8C are process cross-sectional views illustrating a method for manufacturing the semiconductor device according to this embodiment.
Figure 8B:
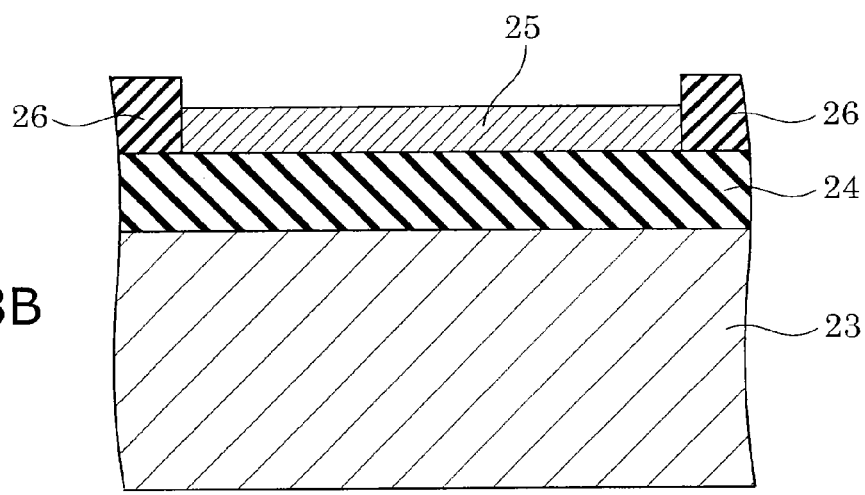
Figure 8C:
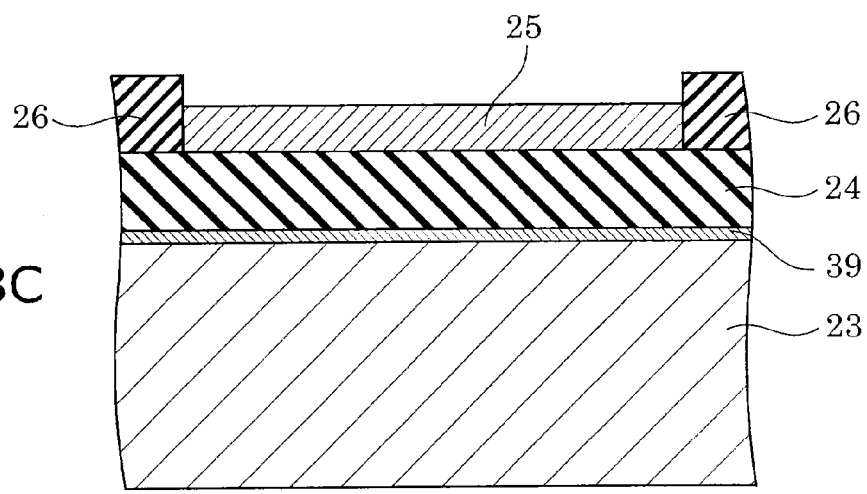

FIGS. 8A to 8C are process cross-sectional views illustrating the method for manufacturing the semiconductor device according to this embodiment.

First, as shown in FIG. 8A, a P-type high-resistance silicon substrate 23 doped with boron and having a specific resistance of 1 kΩ·cm or more is prepared. Next, thermal oxidation is applied to the high-resistance silicon substrate 23 to grow a BOX layer 24 to a thickness of 2 μm in the surface of the high-resistance silicon substrate 23. Next, a silicon plate is laminated to the BOX layer 24 by the smart-cut method to form a silicon layer 25. Thus an SOI substrate 22 is fabricated.

Next, as shown in FIG. 8B, a device isolation region 26 is formed in the silicon layer 25 of the SOI substrate 22. Then, as shown in FIG. 8C, boron ion implantation is performed under the condition of an acceleration voltage of 1.15 MeV and a dose amount of $3.0\times10^{11}$ $cm^{-2}$, for example. Boron ions pass through the silicon layer 25 or the device isolation region 26, pass through the BOX layer 24, and reach the high-resistance silicon substrate 23. Thus a boron-doped layer 39 is formed in a region of the high-resistance silicon substrate 23 being in contact with the BOX layer 24.

Next, as shown in FIG. 7, the conventional method for manufacturing a MOSFET is followed. More specifically, a channel region 30 is formed by ion implantation. A gate oxide film 31 is formed on the channel region 30. A gate electrode 32 is formed on the gate oxide film 31. A source region 28 and a drain region 29 are formed by ion implantation of N-type dopants using the gate electrode 32 as a mask. A sidewall 33 is formed so as to cover the side face of the gate electrode 32. Ohmic contact layers 34 and 35 are formed by ion implantation, and activation annealing is performed. A source electrode 36 and a drain electrode 37 are formed by forming ohmic layers at the surface of the ohmic contact layers 34 and 35. Thus a MOSFET 27 is fabricated. Then an interlayer insulating film (not shown) and an interconnect (not shown) are formed.

Next, the operation and effect of this embodiment are described in contrast to a comparative example.

Figure 9:
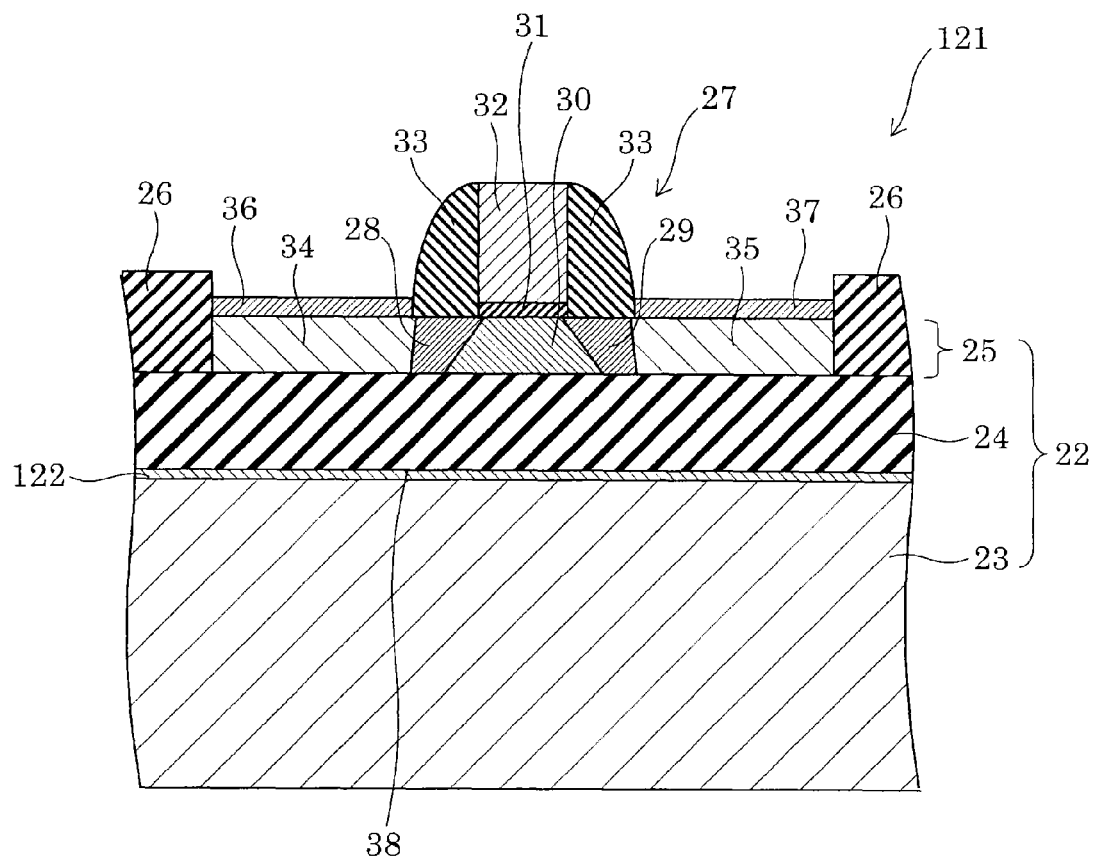
FIG. 9 is a cross-sectional view illustrating a semiconductor device according to a comparative example of this embodiment.

FIG. 9 is a cross-sectional view illustrating a semiconductor device according to a comparative example of this embodiment.

As shown in FIG. 9, the semiconductor device 121 according to the comparative example has no boron-doped layer 39 (see FIG. 7) in the region of the high-resistance silicon substrate 23 being in contact with the BOX layer 24. The configuration of the semiconductor device 121 other than the foregoing is the same as that of the semiconductor device 21 according to this embodiment described above. The method for manufacturing the semiconductor device 121 is the same as the above method for manufacturing the semiconductor device 21 except that boron ion implantation is omitted.

In the semiconductor device 121, electrons occur in a region of the high-resistance silicon substrate 23 being in contact with the interface 38 with the BOX layer 24 and serve as interface carriers to form an interface carrier layer 122. The concentration of interface carriers depends on the material and thickness of the BOX layer 24. In the case where the BOX layer 24 is a thermal oxide film, the sheet concentration of interface carriers is $4.0\times10^{10}$ $cm^{-2}$ or more when the thickness of the BOX layer 24 is 0.1 μm or more, and the sheet concentration of interface carriers is $7.0\times10^{10}$ $cm^{-2}$ when the thickness is 2.0 μm.

When an RF signal is inputted to the semiconductor device 121 like this, interface carriers migrate along the interface 38 to generate harmonics. In contrast, in the semiconductor device 21 according to this embodiment, the boron-doped layer 39 serves for charge compensation of interface carriers. Hence harmonic generation is suppressed even if an RF signal is inputted.

Next, a third embodiment of the invention is described.

Figure 10:
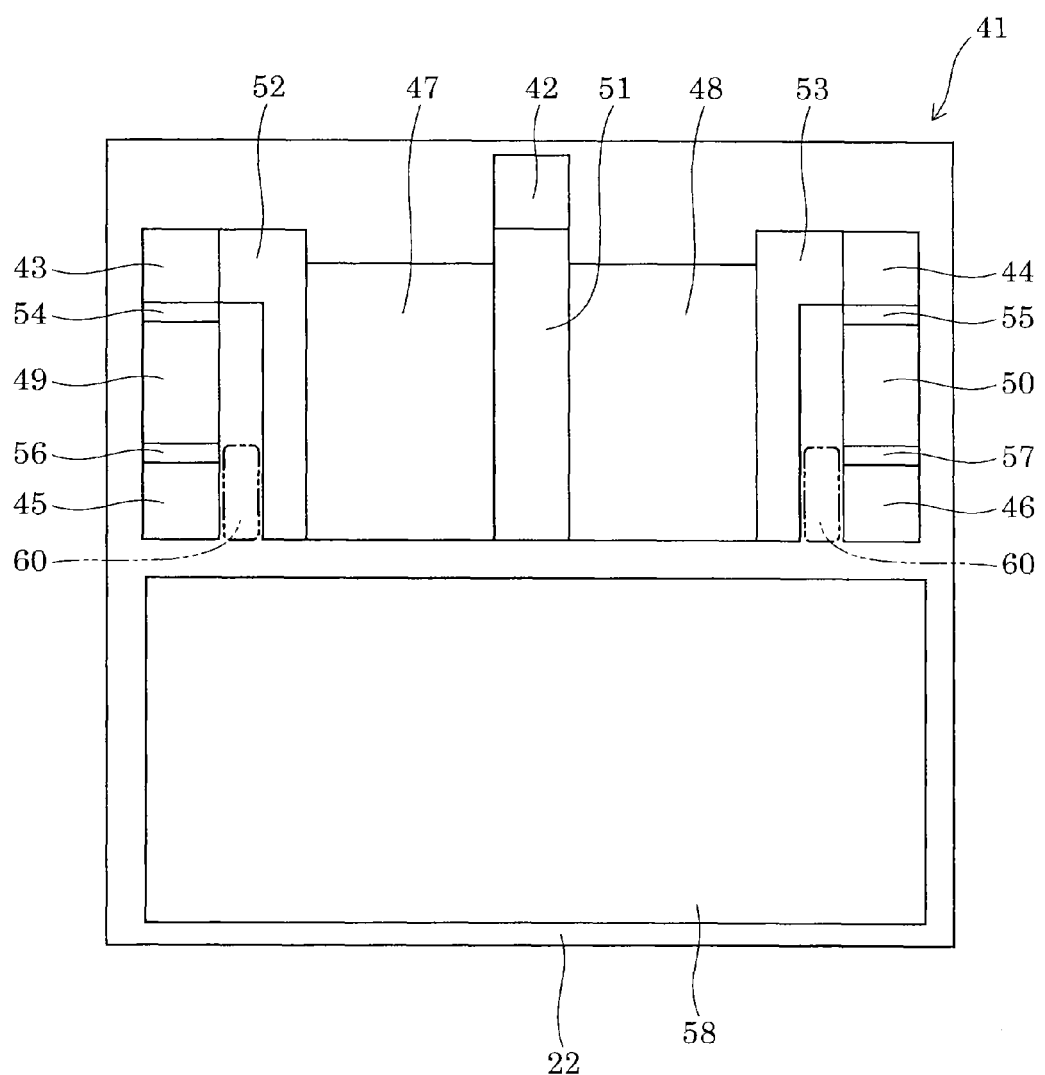
FIG. 10 is a plan view illustrating a semiconductor device according to a third embodiment of the invention.

FIG. 10 is a plan view illustrating a semiconductor device according to this embodiment.

Figure 11:
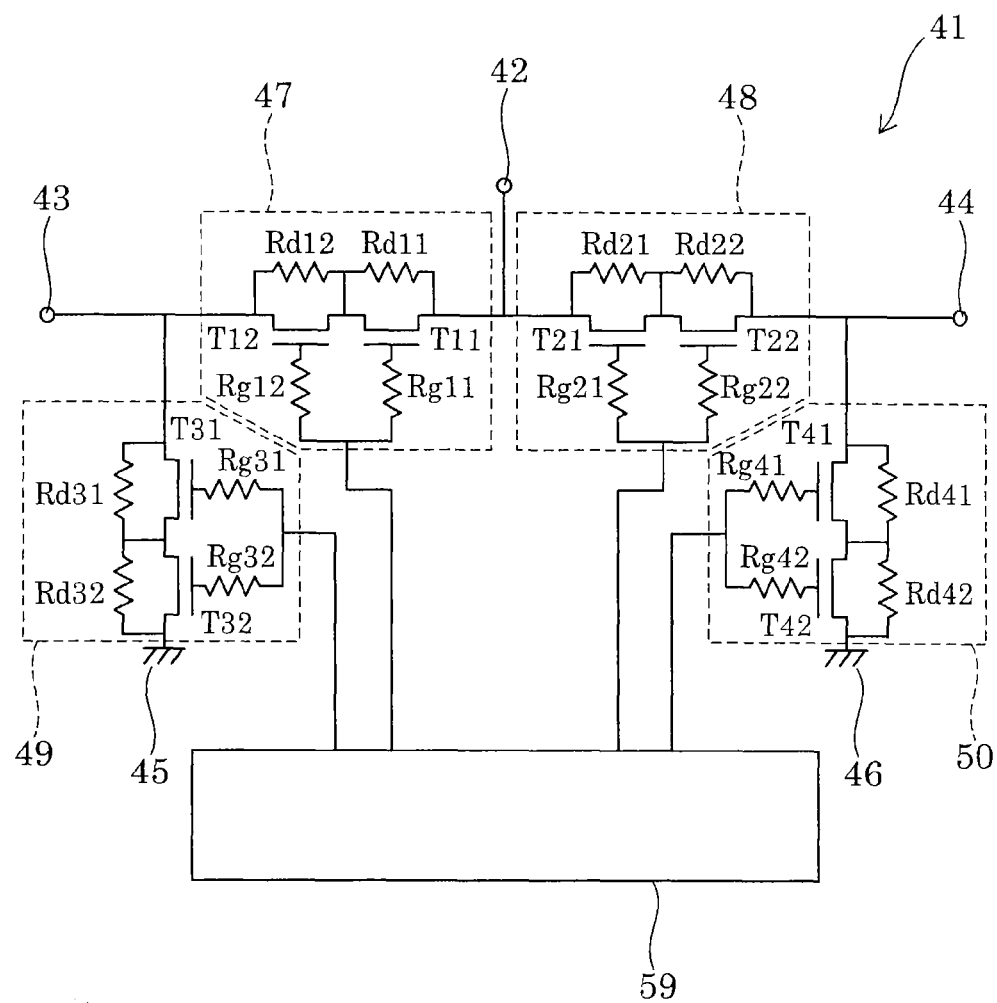
FIG. 11 is a circuit diagram illustrating the semiconductor device according to this embodiment.

FIG. 11 is a circuit diagram illustrating the semiconductor device according to this embodiment.

The semiconductor device according to this embodiment is an example where the MOSFET shown in the above second embodiment is applied to a radio frequency switch circuit, and particularly to a shunt SPDT (single-pole double-throw) switch circuit.

As shown in FIG. 10, the semiconductor device 41 according to this embodiment includes an interlayer insulating film 40 formed on an SOI substrate. On the interlayer insulating film 40 are provided an antenna pad 42 to be connected to an antenna terminal; a transmit pad 43 to be connected to a first RF terminal, e.g., an RF terminal of an external transmitting circuit (not shown); a receive pad 44 to be connected to a second RF terminal, e.g., an RF terminal of an external receiving circuit (not shown); and GND pads 45 and 46 to be placed at the ground potential. Here, the connection relationship between the above pads and terminals, and the terms "antenna pad", "transmit pad", "receive pad", and "GND pad" are only for convenience of facilitating description. More specifically, the antenna pad 42 does not necessarily need to be connected to an antenna. The transmit pad 43 and the receive pad 44 do not necessarily need to be connected to a transmitting circuit and a receiving circuit. The fixed potential applied to the GND pads 45 and 46 does not necessarily need to be the ground potential. That is, the intended use of the semiconductor device 41 is arbitrary, and is not limited to switching among an antenna, a transmitting circuit, and a receiving circuit.

The semiconductor device 41 also includes a through MOSFET region 47 provided with a MOSFET for switching connection and disconnection of the antenna pad 42 to the transmit pad 43; a through MOSFET region 48 provided with a MOSFET for switching connection and disconnection of the antenna pad 42 to the receive pad 44; a shunt MOSFET region 49 provided with a MOSFET for switching connection and disconnection of the transmit pad 43 to the GND pad 45; and a shunt MOSFET region 50 provided with a MOSFET for switching connection and disconnection of the receive pad 44 to the GND pad 46.

The semiconductor device 41 further includes an interconnect region 51 provided with an interconnect for connecting the antenna pad 42 to the through MOSFET regions 47 and 48; an interconnect region 52 provided with an interconnect for connecting the through MOSFET region 47 to the transmit pad 43; an interconnect region 53 provided with an interconnect for connecting the through MOSFET region 48 to the receive pad 44; an interconnect region 54 provided with an interconnect for connecting the transmit pad 43 to the shunt MOSFET region 49; an interconnect region 55 provided with an interconnect for connecting the receive pad 44 to the shunt MOSFET region 50; an interconnect region 56 provided with an interconnect for connecting the shunt MOSFET region 49 to the GND pad 45; and an interconnect region 57 provided with an interconnect for connecting the shunt MOSFET region 50 to the GND pad 46. Each interconnect region may illustratively include one interconnect formed from one continuous metal film, or a plurality of interconnects spaced from each other. Furthermore, the semiconductor device 41 includes a logic circuit region 58 provided with a logic circuit. A control circuit 59 is formed in the logic circuit region 58.

As shown in FIG. 11, in the through MOSFET region 47, transistors T11 and T12 are connected in series between the antenna pad 42 and the transmit pad 43, and in the through MOSFET region 48, transistors T21 and T22 are connected in series between the antenna pad 42 and the receive pad 44. In the shunt MOSFET region 49, transistors T31 and T32 are connected in series between the transmit pad 43 and the GND pad 45, and in the shunt MOSFET region 50, transistors T41 and T42 are connected in series between the receive pad 44 and the GND pad 46.

Each of the above transistors is a MOSFET serving as a radio frequency switching element and has the same structure as the MOSFET 27 in the above second embodiment. The gate electrode of the transistors T11-T42 is connected to the control circuit 59 through resistors Rg11-Rg42, respectively. Furthermore, resistors Rd11-Rd42 are connected in parallel to the transistors T11-T42 between the source and the drain thereof, respectively. The resistors Rd11-Rd42 serve to maintain a fixed bias voltage between the source and the drain of the respective transistors. Furthermore, an interlayer insulating film (not shown) is formed on the SOI substrate 22 so as to cover each MOSFET, and the interconnect (not shown) provided in each of the above interconnect regions is formed on this interlayer insulating film.

Next, the operation and effect of the semiconductor device 41 according to this embodiment are described.

The control circuit 59 controls the potential of the gate electrode of the transistors T11-T42 through the resistors Rg11-Rg42, thereby turning each transistor into the conducting or non-conducting state to switch between conducting and blocking an RF signal. For example, if the transistors T11 and T12 of the through MOSFET region 47 and the transistors T41 and T42 of the shunt MOSFET region 50 are turned into the conducting state, and the transistors T21 and T22 of the through MOSFET region 48 and the transistors T31 and T32 of the shunt MOSFET region 49 are turned into the non-conducting state, then the transmit pad 43 is connected to the antenna pad 42, and an RF signal outputted from the transmitting circuit is transmitted from the antenna. On the other hand, if the transistors T21 and T22 of the through MOSFET region 48 and the transistors T31 and T32 of the shunt MOSFET region 49 are turned into the conducting state, and the transistors T11 and T12 of the through MOSFET region 47 and the transistors T41 and T42 of the shunt MOSFET region 50 are turned into the non-conducting state, then the antenna pad 42 is connected to the receive pad 44, and an RF signal received by the antenna is inputted to the receiving circuit.

By such operation, an RF signal flows through the through MOSFET regions 47 and 48, the interconnect regions 51, 52, and 53, the transmit pad 43, and the receive pad 44, whereas the ground potential continues to be applied to the GND pads 45 and 46. Hence, if the boron-doped layer 39 (see FIG. 7) is not formed as in the semiconductor device shown in FIG. 9, interface carriers migrate in response to the voltage between the RF signal and the ground potential. This results in harmonics due to the RF signal. Here, such migration of interface carriers is particularly prominent in a region 60 (see FIG. 10) between the interconnect 52, 53 conducting the RF signal and the GND pad 45, 46 placed at the ground potential. In contrast, in the semiconductor device 41 according to this embodiment, the boron-doped layer 39 formed therein serves for charge compensation of interface carriers, suppressing harmonic generation.

In the following, the effect of this embodiment is quantitatively described with reference to a numerical example.

First, an SOI substrate without boron doping (comparative example) and an SOI substrate doped with boron (inventive example) were fabricated. In both substrates, the thickness of the high-resistance silicon substrate 23 was 725 μm, its specific resistance was 1 kΩ·cm, the thickness of the BOX layer 24 was 2 μm, and the thickness of the silicon layer was 0.13 μm. Here, in the SOI substrate of the comparative example, because no boron-doped layer 39 is formed, electrons occurred as interface carriers, and the concentration thereof was $7.0 \times 10^{10}$ cm$^{-2}$. In contrast, in the SOI substrate of the inventive example, boron was ion-implanted at an acceleration voltage of 1.15 MeV and a dose amount of $3.0 \times 10^{11}$ cm$^{-2}$ to form a boron-doped layer 39. Here, the doping concentration in the high-resistance silicon substrate 23 was $7.8 \times 10^{10}$ cm$^{-2}$. Hence, in this case, interface carriers contributing to conduction were holes, and the concentration thereof was $0.8 \times 10^{10}$ cm$^{-2}$. It is noted that, even at the same concentration, holes have a smaller contribution to conduction than electrons because the hole has a smaller mobility than the electron.

Then the above radio frequency switch was formed on these SOI substrates. Here, each transistor (MOSFET) was an NMOS, and the gate length ($L_g$) was 0.25 μm. Then the threshold voltage ($V_{th}$) was 0.5 V, the on-resistance ($R_{on}$) was 1.5 Ωmm, and the off-capacitance ($C_{off}$) was 0.28 pF/mm. The gate width ($W_g$) was 0.6 mm for the through NMOS (T11-T22) and 0.2 mm for the shunt NMOS (T31-T42). Each additional gate resistance (Rg11-Rg42) was 10 kΩ, and each additional source-drain resistance (Rd11-Rd42) was 10 kΩ.

In these semiconductor devices, a potential of +3 V was applied to the gate electrode of the NMOS constituting the through MOSFET region 47 and the shunt MOSFET region 50 to turn it into the conducting state, and a potential of 0 V (ground potential) was applied to the gate electrode of the NMOS constituting the through MOSFET region 48 and the shunt MOSFET region 49 to turn it into the non-conducting state. Then an RF signal having a frequency of 900 MHz was passed from the transmit pad 43 to the antenna pad 42, and second harmonics were measured. The measurement result is shown in TABLE 2 below. As seen from TABLE 2, generation of second harmonics was suppressed more effectively in the inventive example than in the comparative example.

TABLE 2

| | Boron-doped layer | RF signal power (dBm) | |
|---|---|---|---|
| | | 20 | 35 |
| Inventive example | Included | −90 dBc | −75 dBc |
| Comparative example | Not included | −80 dBc | −65 dBc |

In this embodiment, the specific resistance of the high-resistance silicon substrate 23 is 1 kΩ·cm or more. This is intended for decreasing the parasitic capacitance of the MOSFET. Hence the specific resistance of the high-resistance silicon substrate 23 may be less than 1 kΩ·cm as long as the parasitic capacitance of the MOSFET does not affect the performance of the radio frequency switch circuit. Furthermore, the conductivity type of the high-resistance silicon substrate 23 is not limited to P-type, but may be N-type.

In this embodiment, the thickness of the BOX layer 24 is 2 μm. This is also intended for decreasing the parasitic capacitance of the MOSFET. More specifically, an SOI substrate includes a thick BOX layer, which advantageously allows reduction of parasitic capacitance between the element formed thereon and the silicon substrate, thereby enhancing the speed of the element. In contrast, if a CMOS is formed on a conventional substrate other than the SOI substrate, the magnitude of parasitic capacitance is determined by the well formed by ion implantation and is greater than in the case of using the SOI substrate. However, if the BOX layer in the SOI substrate is thinned to a thickness of approximately 0.1 μm, the parasitic capacitance of the MOSFET is comparable in magnitude to the parasitic capacitance of the MOSFET formed on a conventional substrate, losing the advantage of using the SOI substrate. Furthermore, process change is required, increasing the development cost. Hence the thickness of the BOX layer 24 is preferably 0.1 μm or more.

In this embodiment, the smart-cut method is illustratively used to fabricate the SOI substrate, but the invention is not limited thereto. For example, the SOI substrate may be fabricated by the SIMOX (separation by implanted oxygen) method, where oxygen ions are implanted into a silicon substrate, followed by annealing to cause chemical reaction between silicon and oxygen, thereby forming a BOX layer.

In this embodiment, in each of the through MOSFET regions and the shunt MOSFET regions, two MOSFETs are illustratively connected in series. However, as shown in the fourth embodiment described below, the number of MOSFETs is not limited to two. In general, in order to enhance power handling, two or more MOSFETs are disposed in series (stacked). Here, to obtain the same characteristics despite the increase of the number of stacks, the gate width of each MOSFET also needs to be increased in proportion to the number of stacks. Hence, as the number of stacks increases, the source/drain area in each stack increases. In this case, in a conventional substrate other than the SOI substrate, the increase of source/drain area results in an increased RF signal flowing through the silicon substrate, decreasing the device isolation. In contrast, in this embodiment, use of the SOI substrate allows isolation between the MOSFET and the high-resistance silicon substrate 23 by a thick BOX layer. Thus no current flows between MOSFETs through the silicon substrate, and there is no decrease in characteristics even if the gate width is increased.

Furthermore, in the above first to third embodiment, boron (B) is illustratively used as an acceptor for charge compensation of interface carriers. However, the invention is not limited thereto, but other acceptors may be used. Nevertheless, in the case where a thick silicon oxide film is formed and acceptors are implanted through the silicon oxide film, boron is suitable, because boron has the highest penetrability for acceleration voltage.

Next, a fourth embodiment of the invention is described.

Figure 12:
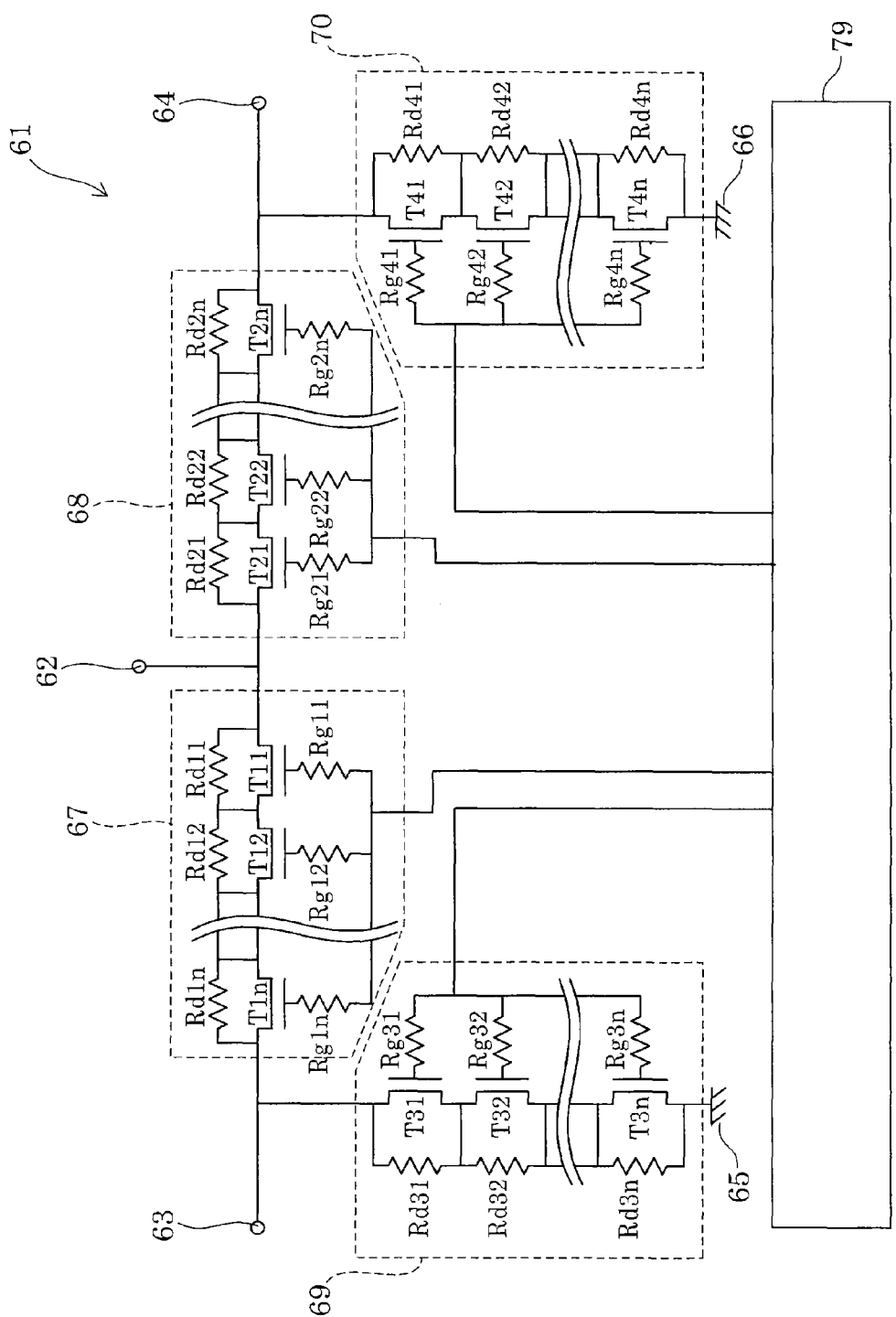
FIG. 12 is a circuit diagram illustrating a semiconductor device according to a fourth embodiment of the invention.

FIG. 12 is a circuit diagram illustrating the semiconductor device according to this embodiment.

Figure 13:
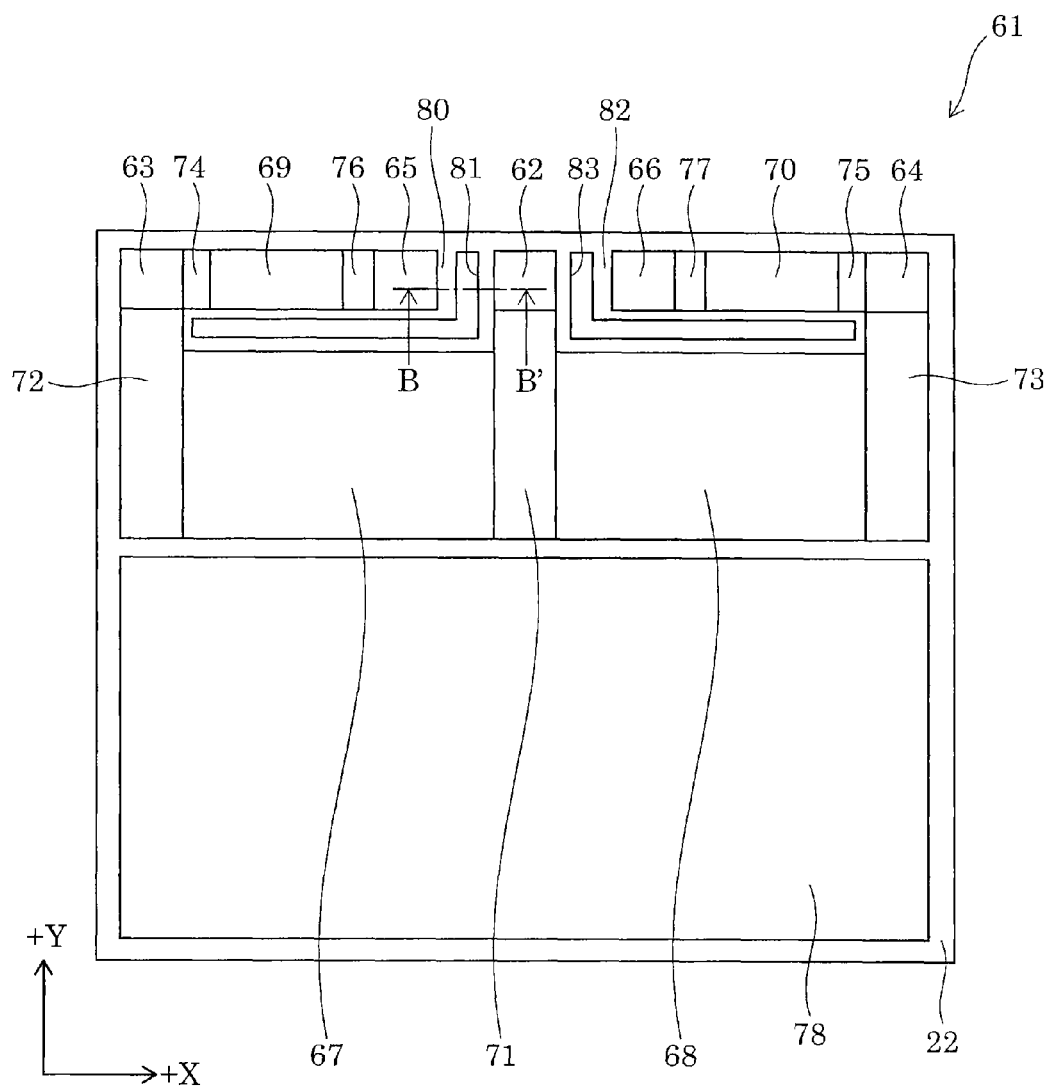
FIG. 13 is a plan view illustrating the semiconductor device according to this embodiment.

FIG. 13 is a plan view illustrating the semiconductor device according to this embodiment.

Figure 14:
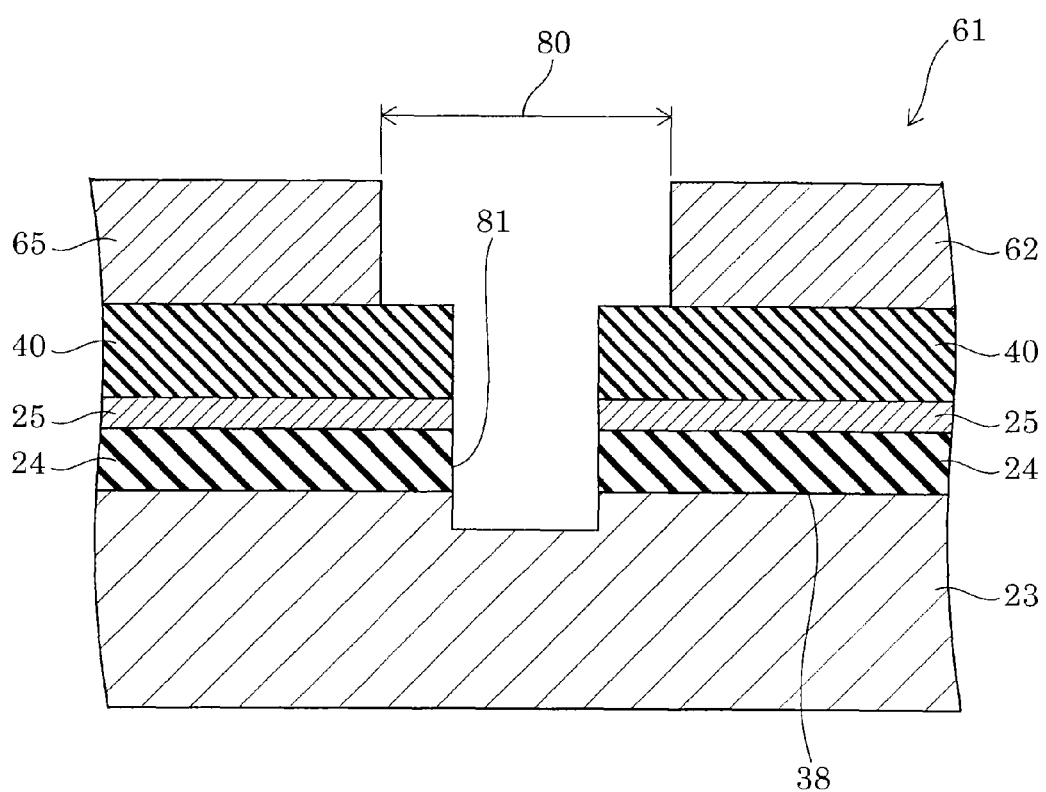
FIG. 14 is a cross-sectional view taken along line B-B' shown in FIG. 13.

FIG. 14 is a cross-sectional view taken along line B-B' shown in FIG. 13.

In FIG. 13, for convenience of description, an orthogonal coordinate system having X and Y direction is assumed in parallel to the surface of the semiconductor device. The same applies to other plan views described below.

Like the above third embodiment, the semiconductor device according to this embodiment is fabricated by forming MOSFETs on an SOI substrate and receives as input a radio frequency signal having a frequency of 500 MHz or more and a power of 20 dBm or more. However, in contrast to the above first to third embodiment, the semiconductor device includes no boron-doped layer. Instead, in this embodiment, a trench reaching the high-resistance silicon substrate is formed in the silicon layer and the BOX layer of the SOI substrate. The same applies to the fifth to eighth embodiment described below.

As shown in FIG. 12, the basic circuit configuration of the semiconductor device 61 according to this embodiment is the same as that in the above third embodiment (see FIG. 11). More specifically, through MOSFET regions 67 and 68 are connected between an antenna pad 62 and a transmit pad 63 and between the antenna pad 62 and a receive pad 64, respectively. Shunt MOSFET regions 69 and 70 are connected between the transmit pad 63 and a GND pad 65 and between the receive pad 64 and a GND pad 66, respectively. The function of each pad and each MOSFET region is the same as that in the above third embodiment.

In each MOSFET region, in order to enhance power handling characteristics, n (where n is an integer not less than 2) NMOS transistors are connected in series (stacked). Let $V_{th}$ be the threshold voltage of each transistor, $V_{off}$ the off-voltage, $Z_0$ the impedance of the overall MOSFET regions, and $P_{max}$ the maximum allowable power of the overall MOSFET regions. Then $P_{max}$ can be expressed by the following formula (I). As seen from the following formula (I), for $V_{th}$=1.0 V, $V_{off}$=0 V, and $Z_0$=50Ω, 18 stacks (n=18) are needed to pass a power of 35 dBm.

$$P_{max} = \frac{\{n \times (V_{th} - V_{off})\}^2}{2 \times Z_0} \quad (1)$$

The gate electrode of each NMOS is supplied with a potential from a control circuit 79 through a resistor Rg11-Rg4n, and a resistor Rd11-Rd4n is connected in parallel between the source and the drain of each NMOS.

On the other hand, as shown in FIG. 13, the semiconductor device 61 according to this embodiment is different in layout from the semiconductor device 41 (see FIG. 10) according to the above third embodiment.

The layout of the semiconductor device 61 is described, beginning with the portions in common with the semiconductor device 41 according to the third embodiment. A logic circuit region 78 is provided in a generally half region of the surface of the semiconductor device 61, more specifically in a region on the −Y direction side, and the control circuit 79 (see FIG. 12) is formed in this logic circuit region 78. A signal passing region for passing an RF signal is provided in a remaining generally half region of the surface of the semiconductor device 61, more specifically in a region on the +Y direction side. The antenna pad 62 is provided at the edge of the signal passing region on the +Y side and at the center in the X direction, and an interconnect region 71 is provided to extend from the antenna pad 62 to the −Y direction. The layout of the signal passing region is symmetric in the X direction with respect to the center line of the antenna pad 62 and the interconnect region 71. The layout like this also applies to the other embodiments described below.

Next, in the layout of the semiconductor device 61, the portions specific to this embodiment are described. As viewed from the portion of the interconnect region 71 on the −Y direction side, the through MOSFET region 67 is provided on the −X direction side, and an interconnect region 72 is provided further on the −X direction side. The interconnect region 72 extends out further toward the +Y direction side than the through MOSFET region 67, and the transmit pad 63 is provided on the +Y direction side of the interconnect region 72. The transmit pad 63 is located at the corner of the semiconductor device 61 on the −X, +Y side. From the transmit pad 63 toward the +X direction, an interconnect region 74, the shunt MOSFET region 69, an interconnect region 76, and the GND pad 65 are aligned in this order and ended by the GND pad 65. The GND pad 65 is located on the −X side as viewed from the antenna pad 62, and spaced therefrom by a certain distance. Thus an L-shaped gap region 80 is formed so as to be surrounded by the antenna pad 62, the interconnect region 71, the through MOSFET region 67, the interconnect region 72, the transmit pad 63, the interconnect region 74, the shunt MOSFET region 69, the interconnect region 76, and the GND pad 65. An L-shaped trench 81 is formed in this gap region 80.

On the other hand, on the +X direction side of the antenna pad 62 and the interconnect region 71, the through MOSFET region 68, an interconnect region 73, the receive pad 64, an interconnect region 75, the shunt MOSFET region 70, an interconnect region 77, and the GND pad 66 are located symmetric to the through MOSFET region 67, the interconnect region 72, the transmit pad 63, the interconnect region 74, the shunt MOSFET region 69, the interconnect region 76, and the GND pad 65 with respect to the center line of the antenna pad 62 and the interconnect region 71. An L-shaped gap region 82 is formed so as to be surrounded by these regions, and an L-shaped trench 83 is formed in the gap region 82. The trenches 81 and 83 are symmetric to each other with respect to the center line of the antenna pad 62 and the interconnect region 71.

In the semiconductor device 61, the antenna pad 62, the transmit pad 63, and the receive pad 64 are radio frequency interconnects for passing an RF signal, and the interconnect region 71, the through MOSFET regions 67 and 68, and the interconnect regions 72 and 73 are provided with radio frequency interconnects for passing an RF signal. On the other hand, the GND pads 65 and 66 are fixed potential interconnects to be placed at the ground potential, and the interconnect regions 76 and 77, the shunt MOSFET regions 69 and 70, and the interconnect regions 74 and 75 are provided with fixed potential interconnects to be placed at the ground potential. Hence, as viewed from above, that is, as viewed perpendicular to the surface of the high-resistance silicon substrate 23, the trenches 81 and 83 are each formed in a region between the radio frequency interconnect and the fixed potential interconnect.

As shown in FIG. 14, the trench 81 passes through the interlayer insulating film 40, the silicon layer 25, and the BOX layer 24 and reaches, and is dug into, the high-resistance silicon substrate 23. The bottom of the trench 81 is located at 1 μm or more below the interface 38 between the high-resistance silicon substrate 23 and the BOX layer 24. The same applies to the trench 83. The peripheral length of the bottom of the trenches 81 and 83 is illustratively 20 μm or more.

Next, the operation and effect of this embodiment are described in contrast to a comparative example.

Figure 15:
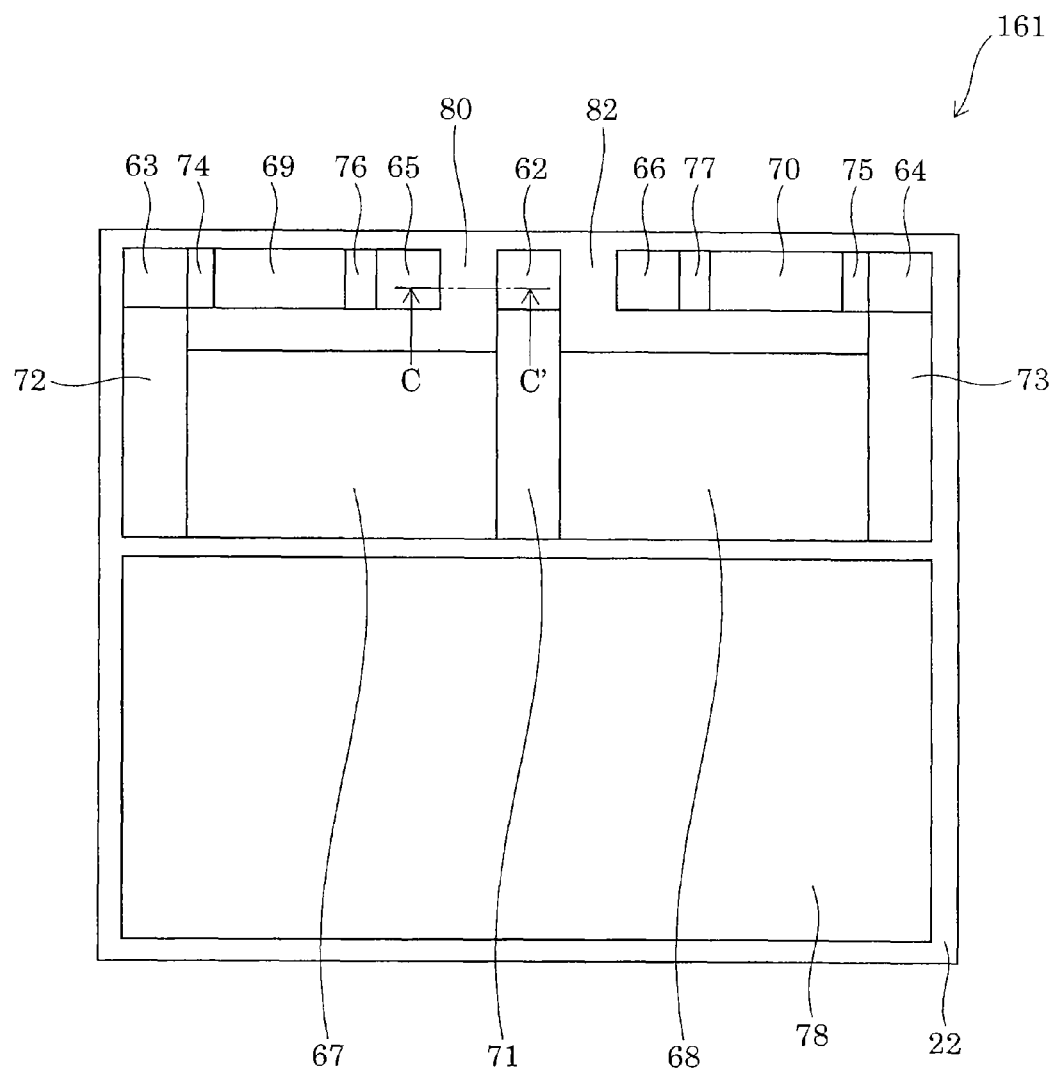
FIG. 15 is a plan view illustrating a semiconductor device according to a comparative example of this embodiment.

FIG. 15 is a plan view illustrating a semiconductor device according to a comparative example of this embodiment.

Figure 16:
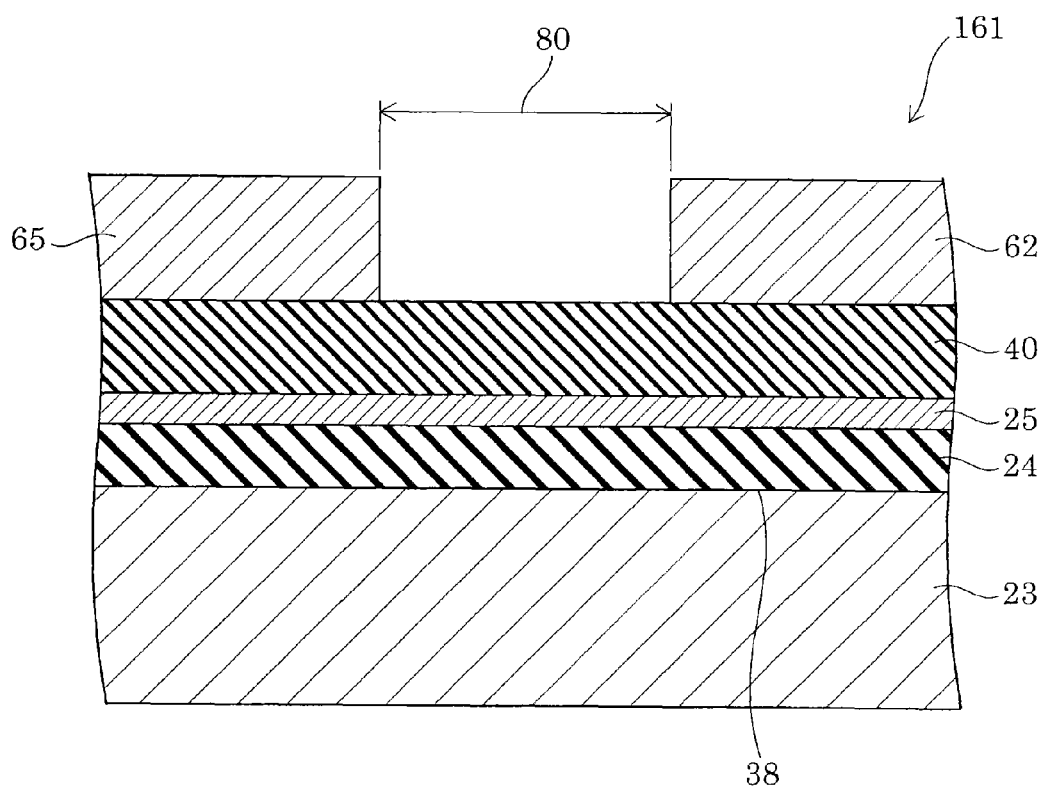
FIG. 16 is a cross-sectional view taken along line C-C' shown in FIG. 15.

FIG. 16 is a cross-sectional view taken along line C-C' shown in FIG. 15.

As shown in FIGS. 15 and 16, the semiconductor device 161 according to this comparative example has no trenches 81 and 83 (see FIG. 14). The configuration of the semiconductor device 161 other than the foregoing is the same as that of the semiconductor device 61 according to this embodiment described above.

In the semiconductor device 161 according to the comparative example, interface carriers composed of electrons occur near the interface 38 of the high-resistance silicon substrate 23 with the BOX layer 24. When an RF signal flows through the above radio frequency interconnect, a radio frequency electric field occurs in the gap with the fixed potential interconnect and causes the interface carriers to migrate, thereby generating higher harmonics.

On the other hand, also in the semiconductor device 61 according to this embodiment, interface carriers occur near the interface 38 of the high-resistance silicon substrate 23. Furthermore, when an RF signal flows through the radio frequency interconnect, a radio frequency electric field occurs in the gap with the fixed potential interconnect. However, in this embodiment, the trenches 81 and 83 are formed between the radio frequency interconnect and the fixed potential interconnect, and no silicon oxide exists in the trenches. Hence no interface carriers exist at the bottom of the trenches. Therefore, among the migration paths of interface carriers, the shortest path connecting between the radio frequency interconnect and the fixed potential interconnect is interrupted. This elongates the migration path of interface carriers by the amount of circumventing the trench and prevents the migration of interface carriers. Furthermore, the area of the interface 38 decreases by the amount of the trenches 81 and 83, decreasing the total number of interface carriers per se. Thus, in this embodiment, generation of higher harmonics is suppressed by preventing the migration of interface carriers and decreasing the total number thereof. To ensure the effect of preventing the migration of interface carriers by diverting their migration, the peripheral length of the bottom of the trenches is preferably 20 μm or more.

In this embodiment, as viewed from the antenna pad 62, trenches are formed on both of the transmit pad 63 side and the receive pad 64 side. Hence harmonic generation can be suppressed on both cases where a high power RF signal having a magnitude of 20 dBm or more flows through the current path between the transmit pad 63 and the antenna pad 62 and where a high power RF signal flows through the current path between the antenna pad 62 and the receive pad 64. Typically, in a radio frequency switch circuit through which an antenna is switched to a transmitting circuit and a receiving circuit in a mobile communication apparatus, the RF signal flowing between the antenna and the receiving circuit is smaller than the RF signal flowing between the transmitting circuit and the antenna. Hence it is possible to omit the trench between the antenna pad and the receive pad. However, if trenches are formed on both of the transmitting side and the receiving side, the transmit pad 63 and the receive pad 64 can be connected also in reverse.

In the following, the effect of this embodiment is quantitatively described with reference to a numerical example.

In the semiconductor device 61 according to this embodiment and the semiconductor device 161 according to the comparative example described above, the dimensions and characteristics of the components were specified as follows. With regard to the SOI substrate 22, the high-resistance silicon substrate 23 was made of a P-type silicon wafer having a specific resistance of 1 kΩ·cm, the thickness of the BOX layer 24 was 2 μm, and the thickness of the silicon layer 25 was 0.1 μm. In this SOI substrate 22, the concentration of interface carriers occurring near the interface 38 was $7.0 \times 10^{10}$ cm$^{-2}$.

In and above the surface of this SOI substrate 22, the conventional CMOS process was used to form NMOS, followed by forming interconnects and pads. Here, the gate length ($L_g$) was 0.25 μm. Then the threshold voltage ($V_{th}$) was 1.0 V, the on-resistance ($R_{on}$) was 1.5 Ωmm, and the off-capacitance ($C_{off}$) was 0.28 pF/mm. The gate width ($W_g$) was 9.0 mm for each through NMOS (T11-T2n) and 3.6 mm for each shunt NMOS (T31-T4n), the number of stacks (n) was 18, each additional gate resistance (Rg11-Rg4n) was 10 kΩ, and each additional source-drain resistance (Rd11-Rd4n) was 10 kΩ. The interlayer insulating film 40 was fabricated by alternately laminating a plurality of insulating layers and a plurality of interconnect layers, and the overall film thickness was 1 μm. Each pad was shaped like a square measuring 100 μm on a side. The distance between the antenna pad 62 and the GND pad 65, and the distance between the antenna pad 62 and the GND pad 66 were each 30 μm.

As shown in FIG. 13, the trenches 81 and 83 were formed in the semiconductor device 61 according to this embodiment. Here, the trenches 81 and 83 were formed to 1 μm below the interface 38, and the width thereof was 20 μm. In contrast, in the semiconductor device according to the comparative example, no trench was formed.

An RF signal having a frequency of 900 MHz and a magnitude of 35 dBm was inputted to the antenna pad 62 of the semiconductor devices thus formed, and second harmonics were measured. In the semiconductor device without trenches (comparative example), the intensity of second harmonics was −75 dBc. In contrast, in the semiconductor device with trenches formed therein (inventive example), the intensity of second harmonics was −80 dBc. It was demonstrated from these results that this embodiment can suppress generation of second harmonics.

In this embodiment, the trenches 81 and 83 are illustratively dug 1 μm or more into the silicon substrate 23. However, the trenches 81 and 83 only need to reach the silicon substrate 23. Then the BOX layer 24 is removed from above the silicon substrate 23 at the bottom of the trenches 81 and 83. Hence interface carriers cannot exist in this region, and migration of interface carriers can be prevented.

Also in this embodiment, like the above third embodiment, the specific resistance and the conductivity type of the high-resistance silicon substrate 23, the thickness of the BOX layer 24, the method for fabricating the SOI substrate 22, and the number of pads are arbitrary. Furthermore, in this embodiment, the semiconductor device is illustratively an SPDT switch circuit to be connected to two RF terminals, that is, an RF terminal of a transmitting circuit and an RF terminal of a receiving circuit. However, the invention is also effectively applicable to a multiport switch circuit to be connected to three or more RF terminals.

Next, a fifth embodiment of the invention is described.

Figure 17:
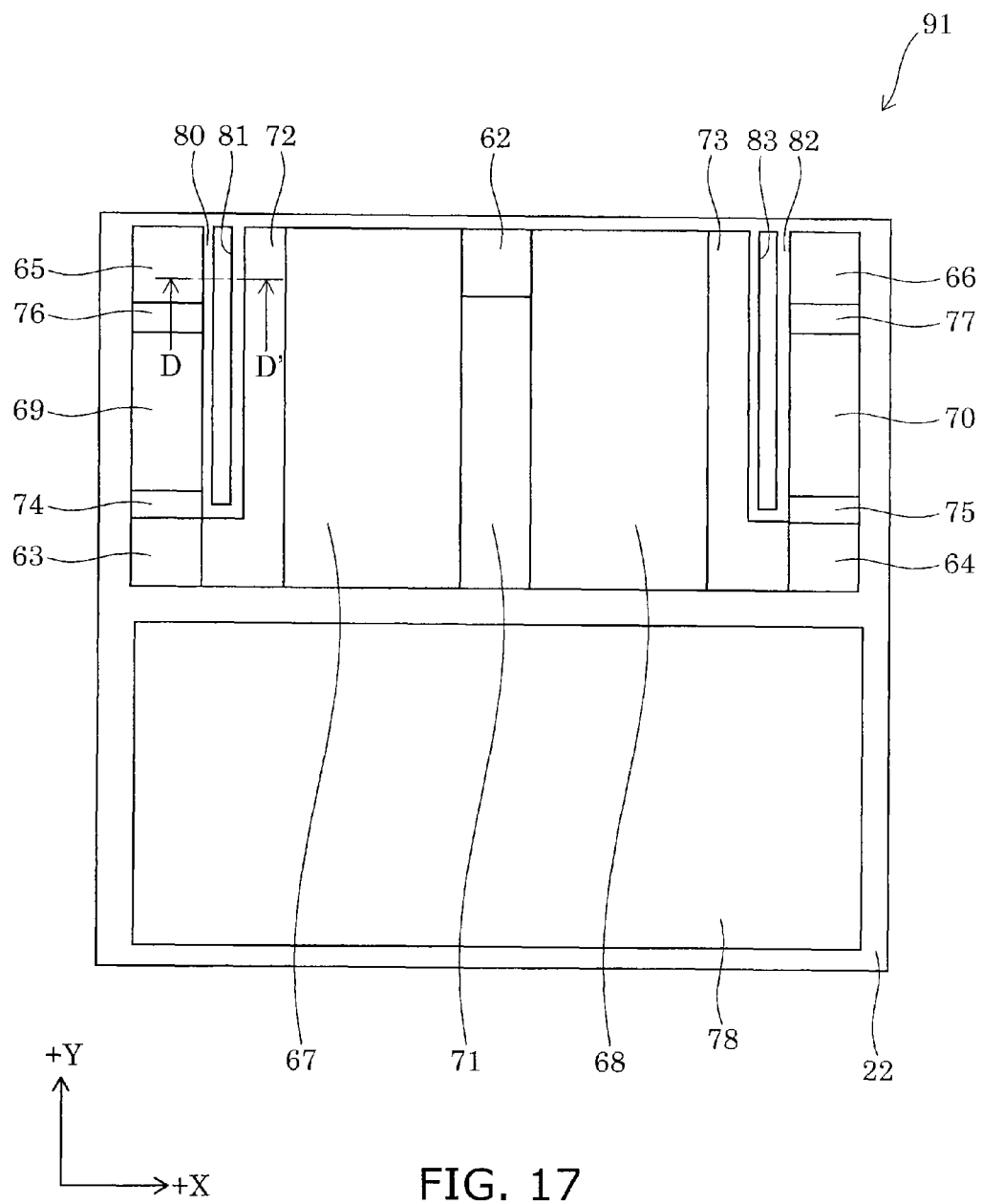
FIG. 17 is a plan view illustrating a semiconductor device according to a fifth embodiment of the invention.

FIG. 17 is a plan view illustrating a semiconductor device according to this embodiment.

The cross-sectional view taken along line D-D' shown in FIG. 17 is the same as FIG. 14 except that the antenna pad 62 therein is replaced by the interconnect in the interconnect region 72.

The circuit diagram of the semiconductor device according to this embodiment is the same as FIG. 12.

As shown in FIG. 17, the semiconductor device 91 according to this embodiment is different in layout from the semiconductor device 61 (see FIG. 13) according to the above fourth embodiment. However, the semiconductor device 91 is the same as the semiconductor device 61 according to the fourth embodiment in the following points: a logic circuit region 78 is provided in a generally half region on the −Y direction side; a signal passing region is provided in a generally half region on the +Y direction side; and the layout of the signal passing region is symmetric in the X direction with respect to the center line of the antenna pad 62 and the interconnect region 71.

In the following, in the layout of the semiconductor device 91, the portions different from the semiconductor device 61 are described. As viewed from the antenna pad 62 and the interconnect region 71, the through MOSFET region 67 is provided in contact with these regions on the −X direction side, and an interconnect region 72 is provided further on the −X direction side. The end of the interconnect region 72 on the −Y direction side extends out toward the −X direction, and the interconnect region 72 is L-shaped as a whole. The transmit pad 63 is provided on the extended line of the out-extending portion of the interconnect region 72, that is, on the −X direction side. The transmit pad 63 is located at the corner of the signal passing region on the −X, −Y side. From the transmit pad 63 toward the +Y direction, an interconnect region 74, the shunt MOSFET region 69, an interconnect region 76, and the GND pad 65 are aligned in this order and ended by the GND pad 65. The GND pad 65 is located at the corner of the semiconductor device 91 on the −X, +Y side. Thus a strip-shaped gap region 80 extending in the Y direction is formed so as to be surrounded by the interconnect region 72, the transmit pad 63, the interconnect region 74, the shunt MOSFET region 69, the interconnect region 76, and the GND pad 65 on three sides, and a strip-shaped trench 81 is formed in this gap region 80.

On the other hand, on the +X direction side of the antenna pad 62 and the interconnect region 71, the through MOSFET region 68, an interconnect region 73, the receive pad 64, an interconnect region 75, the shunt MOSFET region 70, an interconnect region 77, and the GND pad 66 are located symmetric to the through MOSFET region 67, the interconnect region 72, the transmit pad 63, the interconnect region 74, the shunt MOSFET region 69, the interconnect region 76, and the GND pad 65 with respect to the center line of the antenna pad 62 and the interconnect region 71. A strip-shaped gap region 82 extending in the Y direction is formed so as to be surrounded by the interconnect region 73, the receive pad 64, the interconnect region 75, the shunt MOSFET region 70, the interconnect region 77, and the GND pad 66 on three sides, and a strip-shaped trench 83 is formed in the gap region 82. The trenches 81 and 83 are symmetric to each other with respect to the center line of the antenna pad 62 and the interconnect region 71.

The operation and effect of this embodiment are the same as those of the above fourth embodiment.

In the following, the effect of this embodiment is quantitatively described with reference to a numerical example.

Figure 18:
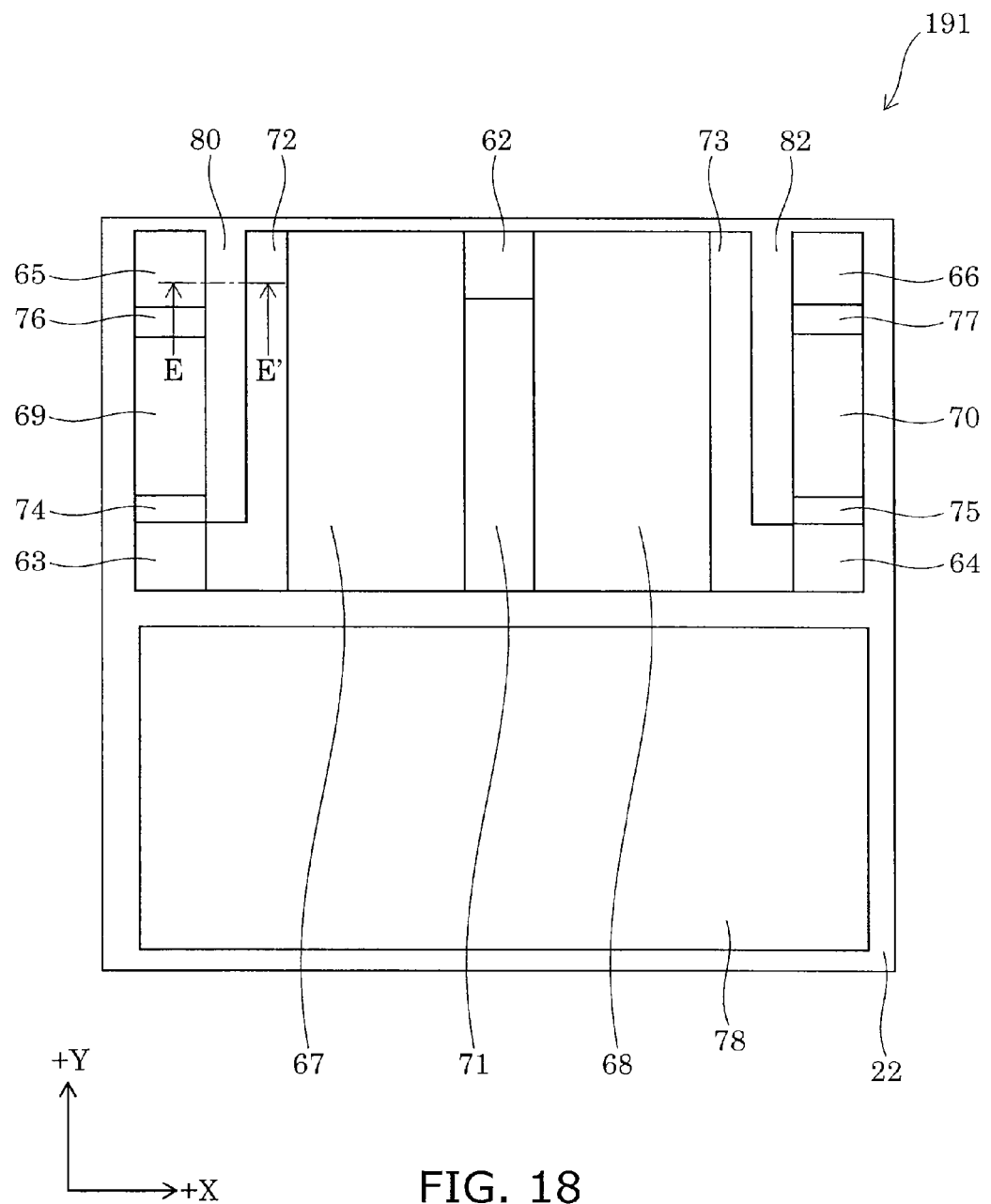
FIG. 18 is a plan view illustrating a semiconductor device according to a comparative example of this embodiment.

FIG. 18 is a plan view illustrating a semiconductor device according to a comparative example of this embodiment.

The cross-sectional view taken along line E-E' shown in FIG. 18 is the same as FIG. 16 except that the antenna pad 62 therein is replaced by the interconnect in the interconnect region 72.

As shown in FIG. 18, the semiconductor device 191 according to this comparative example has no trenches 81 and 83 (see FIG. 17). The configuration of the semiconductor device 191 other than the foregoing is the same as that of the semiconductor device 91 according to this embodiment described above.

In the semiconductor device 91 according to this embodiment and the semiconductor device 191 according to the comparative example, the dimensions and characteristics of the components were specified as in the above fourth embodiment. Here, the distance between the interconnect region 72 and the GND pad 65, and the distance between the interconnect region 73 and the GND pad 66 were each 30 μm. The concentration of interface carriers occurring in the SOI substrate 22 was $7.0 \times 10^{10}$ cm$^{-2}$. Under the same condition as in the fourth embodiment, an RF signal is inputted, and second harmonics were measured. As a result, in the semiconductor device without trenches (comparative example), the intensity of second harmonics was −75 dBc. In contrast, in the semiconductor device with trenches formed therein (inventive example), the intensity of second harmonics was −80 dBc. It was demonstrated from these results that this embodiment can suppress generation of second harmonics.

Next, a sixth embodiment of the invention is described.

Figure 19:
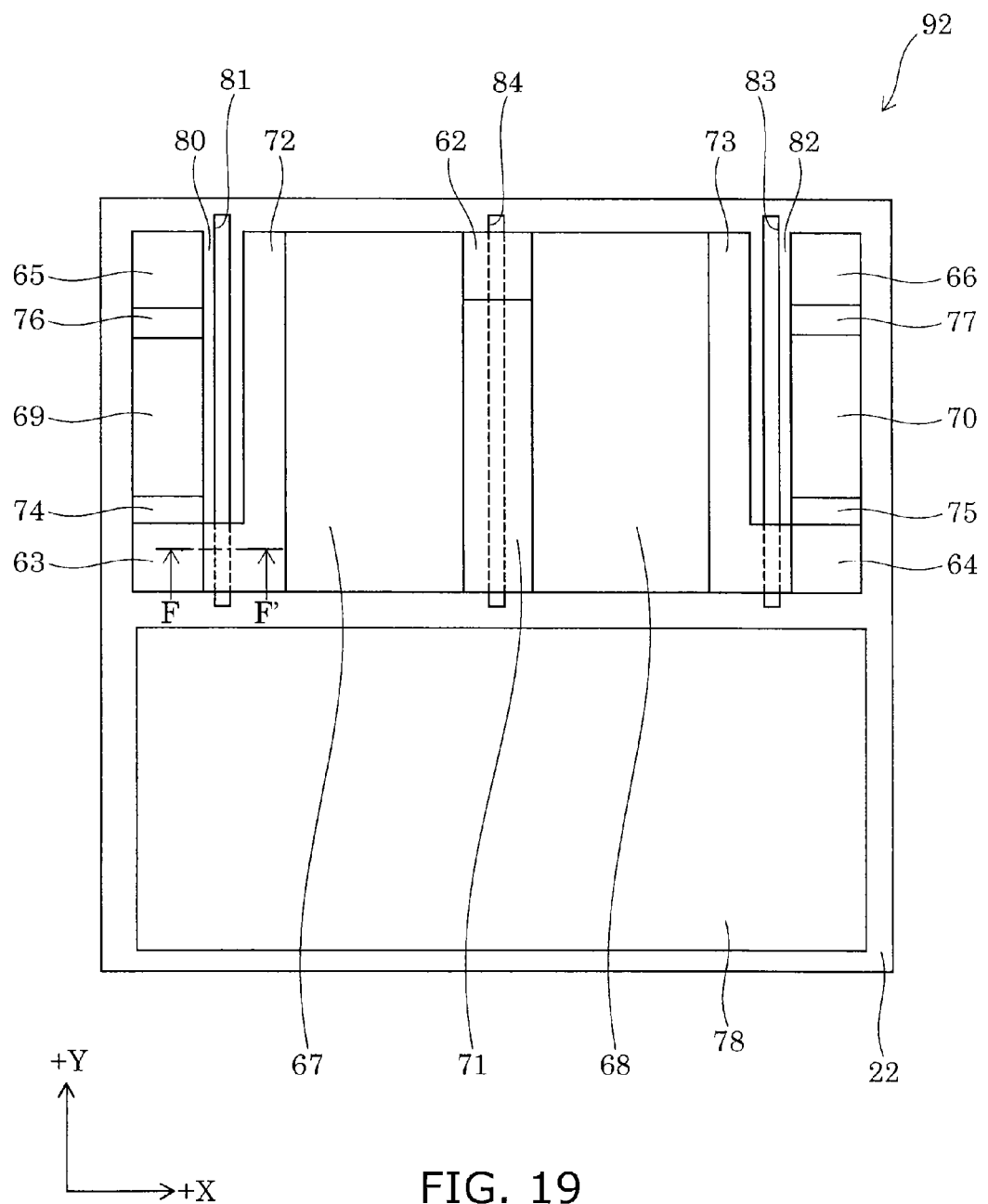
FIG. 19 is a plan view illustrating a semiconductor device according to a sixth embodiment of the invention.

FIG. 19 is a plan view illustrating a semiconductor device according to this embodiment.

Figure 20:
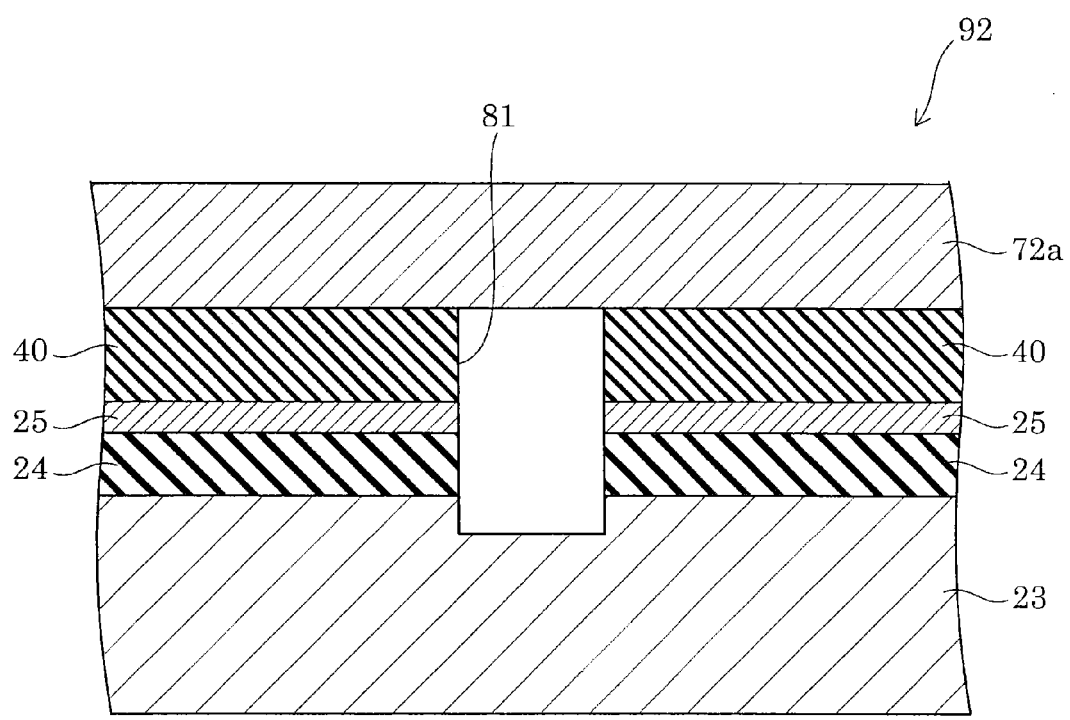
FIG. 20 is a cross-sectional view taken along line F-F' shown in FIG. 19.

FIG. 20 is a cross-sectional view taken along line F-F' shown in FIG. 19.

As shown in FIGS. 19 and 20, the semiconductor device according to this embodiment is different from the semiconductor device 91 (see FIG. 17) according to the above fifth embodiment in that the trench 81 further extends out toward the −Y direction, passing like a tunnel below the interconnect 72a provided in the interconnect region 72. Likewise, the trench 83 also further extends out toward the −Y direction, passing like a tunnel below the interconnect provided in the interconnect region 73. Furthermore, a trench 84 extending in the Y direction is formed directly below the center line of the antenna pad 62 and the interconnect region 71. Like the trenches 81 and 83, the trench 84 passes through the interlayer insulating film 40, the silicon layer 25, and the BOX layer 24, reaches the high-resistance silicon substrate 23, and is illustratively dug a depth of 1 μm into the high-resistance silicon substrate 23. Hence the trench 84 passes like a tunnel below the antenna pad 62 and the interconnect region 71. The configuration of this embodiment other than the foregoing is the same as that of the above fifth embodiment.

Next, the operation and effect of this embodiment are described.

In this embodiment, the trench 81 extending through the downside of the interconnect region 72 serves to more efficiently prevent migration of interface carriers between the through MOSFET region 67 and the shunt MOSFET region 69. Furthermore, the trench 83 extending through the downside of the interconnect region 73 serves to more efficiently prevent migration of interface carriers between the through MOSFET region 68 and the shunt MOSFET region 70. Moreover, the trench 84 serves to prevent migration of interface carriers between the through MOSFET region 67 and the through MOSFET region 68.

Thus, when a high power RF signal flows through one MOSFET region, the migration path of interface carriers from this MOSFET region toward another MOSFET region can be interrupted more efficiently, and hence harmonic generation can be suppressed more effectively. For example, when a high power RF signal flows from the transmit pad 63 toward the antenna pad 62, the RF signal flows through the through MOSFET region 67. At this time, interface carriers existing directly below the through MOSFET region 67 do not propagate to the other shunt MOSFET regions 69 and 70 and the through MOSFET region 68 in the off-state. Consequently, generation of higher harmonics can be suppressed more effectively. The operation and effect of this embodiment other than the foregoing are the same as those of the above fifth embodiment.

Next, a seventh embodiment of the invention is described.

Figure 21:
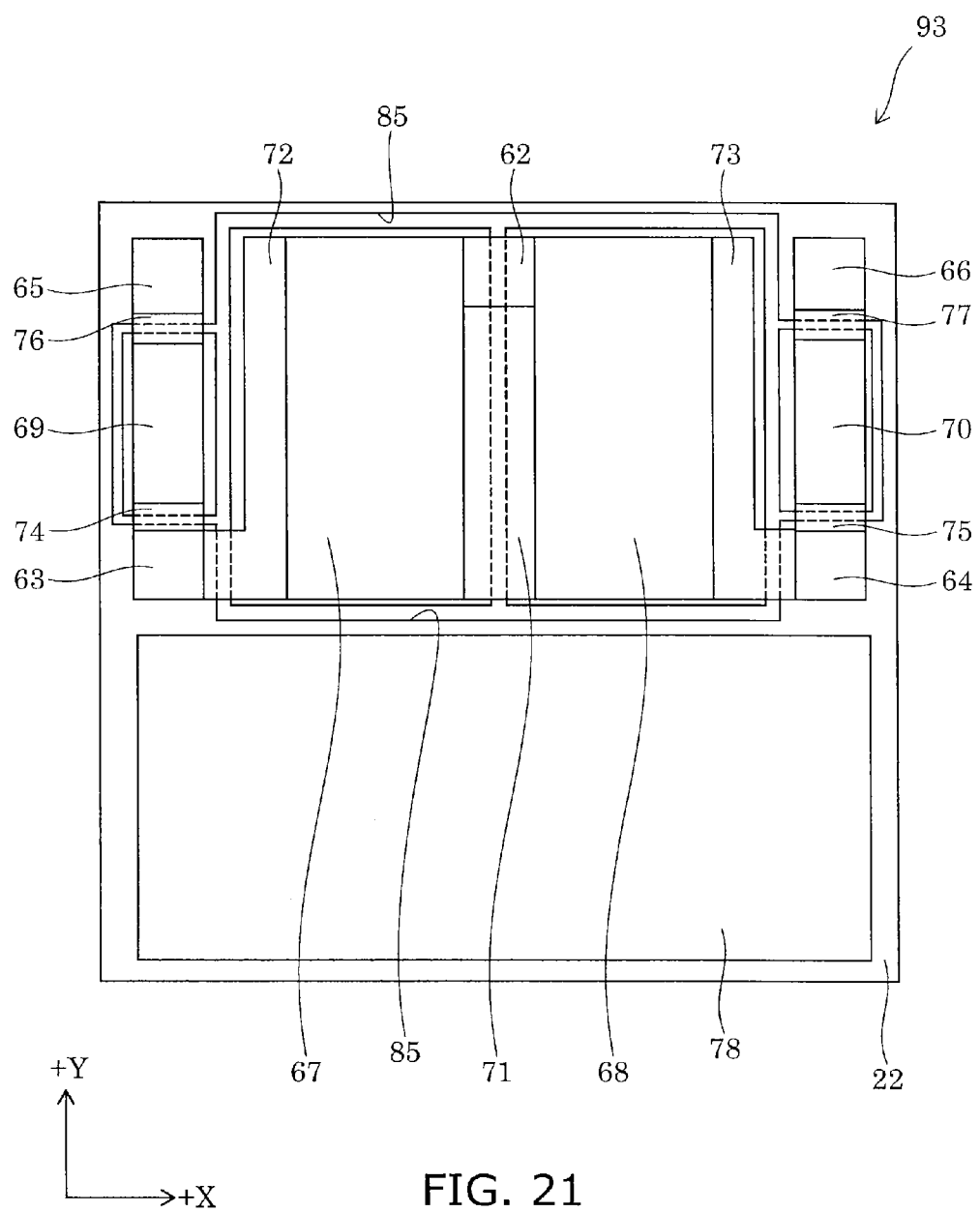
FIG. 21 is a plan view illustrating a semiconductor device according to a seventh embodiment of the invention.

FIG. 21 is a plan view illustrating a semiconductor device according to this embodiment.

As shown in FIG. 21, the semiconductor device 93 according to this embodiment is different from the semiconductor device 91 (see FIG. 17) according to the above fifth embodiment in that the trenches 81 and 83 are replaced by a continuous trench 85 surrounding each MOSFET region. The configuration of this embodiment other than the foregoing is the same as that of the above fifth embodiment.

In the semiconductor device 93 according to this embodiment, the through MOSFET regions 67 and 68 and the shunt MOSFET regions 69 and 70 are each surrounded and partitioned by the trench 85. Thus migration of interface carriers can be prevented more effectively. The operation and effect of this embodiment other than the foregoing are the same as those of the above fifth embodiment.

Next, an eighth embodiment of the invention is described.

In this embodiment, a trench is formed between the stacked MOSFETs in at least one region of the through MOSFET regions 67 and 68 and the shunt MOSFET regions 69 and 70 in the semiconductor device shown in FIG. 15 or 18. More specifically, in a region of the BOX layer 24 located between the MOSFETs as viewed from above, a trench passing through the BOX layer 24 and reaching the high-resistance silicon substrate 23 is formed. Thus, in this MOSFET region, it is possible to prevent an electric field produced by the operation of one MOSFET from propagating to another MOSFET through interface carriers, and hence generation of higher harmonics can be suppressed. For example, it is possible to prevent interface carriers existing directly below the MOSFET in the first stack from propagating to directly below the MOSFETs in the second and subsequent stacks, and hence generation of higher harmonics can be suppressed.

In the above fourth to eighth embodiment, the inside of the trench may be an air layer, or an insulator may be buried therein. In the case of burying an insulator, the insulator is preferably of the type that can avoid occurrence of interface carriers in the high-resistance silicon substrate, and hence an insulator other than silicon oxides is preferable. However, even if interface carriers occur between the buried insulating film and the high-resistance silicon substrate, a trench can be dug into the high-resistance silicon substrate to elongate the propagation path of the interface carriers by the amount of digging. Thus migration of interface carriers can be prevented, and harmonic generation can be suppressed. To ensure this effect, the amount of digging the trench is preferably 1 μm or more. That is, the bottom of the trench is preferably located at 1 μm or more below the interface between the high-resistance silicon substrate and the BOX layer.

The invention has been described with reference to the embodiments. However, the invention is not limited to these embodiments. For example, those skilled in the art can suitably modify the above embodiments by addition, deletion, and/or design change of components, and such modifications are also encompassed within the scope of the invention as long as they include the features of the invention. Furthermore, the above embodiments can be practiced in combination with each other. For example, a boron-doped layer may be formed near the interface between the silicon substrate and the silicon oxide film as in the above first to third embodiment, and a trench reaching the silicon substrate may be formed between the radio frequency interconnect and the fixed potential interconnect as in the above fourth to seventh embodiment. Moreover, in addition thereto, a trench may be formed between the MOSFETs as in the above eighth embodiment.

In the above embodiments, the semiconductor device is illustratively a switch circuit, but the invention is not limited thereto. The invention can be suitably applied to any semiconductor devices including a silicon oxide film on a silicon substrate and receiving an RF signal as input. For example, semiconductor devices consisting only of passive elements such as FBAR (film bulk acoustic resonator) filters or MEMS (microelectromechanical system) switches are also encompassed within the scope of the invention.

The invention claimed is:

1. A semiconductor device adapted to a radio frequency signal, comprising:
    a SOI substrate including a silicon substrate, an oxide layer on the silicon substrate, and a silicon layer on the oxide layer;
    a device isolation region made of insulator and partitioning the silicon layer into an active region;
    a transistor configured to switch on and off conduction of the radio frequency signal and formed in the active region of the silicon layer;
    an acceptor-doped layer formed in a whole region vertically aligned with the active region of the silicon substrate at the interface between the oxide layer and the silicon substrate, the acceptor-doped layer being doped with acceptors; and
    wherein the oxide layer has a thickness of 0.1 to 2.0 μm.

2. The semiconductor device according to claim 1, wherein the acceptor-doped layer has a thickness of 1 μm or less.

3. The semiconductor device according to claim 1, wherein sheet concentration of the acceptors in the acceptor-doped layer is $4.0 \times 10^{10}$ to $3.5 \times 10^{11}$ cm 2.

4. The semiconductor device according to claim 1, wherein the acceptors are boron.

5. The semiconductor device according to claim 1, wherein said transistor comprises:
    a channel region between a source region and a drain region in the silicon layer;
    a gate oxide film formed on the silicon layer directly above the channel region; and
    a gate electrode provided on the gate oxide film directly above the channel region.

6. The semiconductor device according to claim 1, wherein interface carriers of the silicon substrate are holes.

7. The semiconductor device according to claim 1, wherein the acceptor-doped layer has a sheet concentration of the acceptors so as to compensate interface carriers of the silicon substrate.

8. The semiconductor device according to claim 1, wherein the radio frequency signal has a frequency of 500 MHz or more.

* * * * *